US009799820B2

(12) United States Patent
Yonemura et al.

(10) Patent No.: US 9,799,820 B2
(45) Date of Patent: *Oct. 24, 2017

(54) LIQUID-EJECTING HEAD, LIQUID-EJECTING APPARATUS, PIEZOELECTRIC ELEMENT, AND PIEZOELECTRIC MATERIAL

(71) Applicant: SEIKO EPSON CORPORATION, Tokyo (JP)

(72) Inventors: Takayuki Yonemura, Suwa (JP); Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 832 days.

This patent is subject to a terminal disclaimer.

(21) Appl. No.: 14/102,377

(22) Filed: Dec. 10, 2013

(65) Prior Publication Data
US 2014/0097724 A1 Apr. 10, 2014

Related U.S. Application Data

(63) Continuation of application No. 12/914,233, filed on Oct. 28, 2010, now Pat. No. 8,678,560.

(30) Foreign Application Priority Data

Nov. 2, 2009 (JP) ................................. 2009-252445
Mar. 9, 2010 (JP) ................................. 2010-052430
May 19, 2010 (JP) ................................. 2010-115744

(51) Int. Cl.
*B41J 2/045* (2006.01)
*H01L 41/18* (2006.01)
(Continued)

(52) U.S. Cl.
CPC .............. *H01L 41/18* (2013.01); *B41J 2/055* (2013.01); *B41J 2/14233* (2013.01);
(Continued)

(58) Field of Classification Search
None
See application file for complete search history.

(56) References Cited

U.S. PATENT DOCUMENTS 7,216,962 B2  5/2007  Miyazawa et al.
7,759,846 B2  7/2010  Sakashita et al.
(Continued)

FOREIGN PATENT DOCUMENTS

JP      08-17245      1/1996
JP      10-052071     2/1998
(Continued)

OTHER PUBLICATIONS

Sobiestianskas, R., Vengalis, B., & Banys, J. (2009). High-frequency dielectric study of multiferroic Bi0.9La0.1Fe0.9Mn{0.1}O3 thin films. 2009 18th IEEE International Symposium on the Applications of Ferroelectrics. doi:10.1109/isaf.2009.5307574.*

(Continued)

*Primary Examiner* — Erica Lin
(74) *Attorney, Agent, or Firm* — Workman Nydegger

(57) ABSTRACT

A liquid-ejecting head includes a pressure-generating chamber communicating with a nozzle opening, and a piezoelectric element. The piezoelectric layer contains a perovskite complex oxide containing Bi, La, Fe, and Mn and is ferroelectric.

8 Claims, 17 Drawing Sheets

(51) Int. Cl.
   C04B 35/26      (2006.01)
   B41J 2/14       (2006.01)
   H01L 41/187     (2006.01)
   B41J 2/055      (2006.01)
   H01L 41/09      (2006.01)
   H01L 41/318     (2013.01)

(52) U.S. Cl.
   CPC ...... *C04B 35/2608* (2013.01); *H01L 41/0973* (2013.01); *H01L 41/1878* (2013.01); *B41J 2002/14241* (2013.01); *B41J 2202/03* (2013.01); *C04B 2235/3227* (2013.01); *C04B 2235/3262* (2013.01); *C04B 2235/3298* (2013.01); *C04B 2235/441* (2013.01); *C04B 2235/768* (2013.01); *H01L 41/318* (2013.01)

(56) References Cited

U.S. PATENT DOCUMENTS

| | | | |
|---|---|---|---|
| 8,177,995 | B2 | 5/2012 | Kobayashi et al. |
| 2005/0001514 | A1* | 1/2005 | Takeuchi ............ B41J 2/14209 310/328 |
| 2006/0131627 | A1 | 6/2006 | Kondo et al. |
| 2008/0239016 | A1 | 10/2008 | Miura |
| 2008/0265718 | A1 | 10/2008 | Sakashita et al. |
| 2008/0278038 | A1 | 11/2008 | Kobayashi et al. |
| 2009/0267998 | A1 | 10/2009 | Sakashita et al. |

FOREIGN PATENT DOCUMENTS

| | | |
|---|---|---|
| JP | 2000-127392 | 5/2000 |
| JP | 2001-223404 | 8/2001 |
| JP | 2001-335362 | 12/2001 |
| JP | 2005-39166 | 2/2005 |
| JP | 2006-176366 | 7/2006 |
| JP | 2007-116091 | 5/2007 |
| JP | 2007-194429 | 8/2007 |
| JP | 2007-287739 | 11/2007 |
| JP | 2008-192868 | 8/2008 |
| JP | 2008-265289 | 11/2008 |
| JP | 2008-306164 | 12/2008 |
| JP | 2008-311634 | 12/2008 |
| JP | 4266036 | 2/2009 |
| JP | 2009-231482 | 10/2009 |
| JP | 2009-242229 | 10/2009 |
| JP | 2009-252789 | 10/2009 |
| JP | 2009-287066 | 12/2009 |

OTHER PUBLICATIONS

C.-J.Cheng et al., Structural transitions and complex domain structures across a ferroelectric-toantiferroelectric phase boundary in epitaxial Sm-doped BiFe03 thin films, Physical Review B, US, The American Physical Society, Jul. 21, 2009, 80,014109 p. 1-11.

S. Fujino, et al "Combinatorial discovery of a lead-free morphotropic phase boundary in a thin-film piezoelectric perovskite" Applied Physics Letters 92, 202904 (2008).

A. Z. Simoes, et al "Piezoelectric behavior of SrRuO3 buffered lanthanum modified bismuth ferrite thin films grown by chemical method" Applied Physics Letters 93, 142902 (2008).

S. K. Singh et al "Room temperature ferroelectric properties of Mn-substituted BiFeO3 thin films deposited on Pt electrodes using chemical solution deposition" Applied Physics Letters 88, 262908 (2006).

G. L Yuan, et al. Structural transformation and ferroelectroric-paraelectric phase transition in Bi1-xLazFeO3(x=0-0.25) multiferroic ceramics, Journal of Physics D: Applied Physics, US, Institute of Physics Publishing, Feb. 2007, Issue 4. p. 1996-1120.

Zhang, et al., Preparation, structures, and multiferoic properties of single phase Bi1-xLaxFe03 "x=0-0.40) ceramics, Apr. 19, 2006, Journal of Applied Physics 100, 114108.

Sobiestianskas et al., High-Frequency Dielectric Study of MultiferroicBio, 9LaO1FeIO. 9MnO. 103 Thin Films, Applications of Ferroelectrics, 2009. ISAF 2009. 18th IEEE International Symposiun on the, US, The Institute of Electrical and Electronics Engineers, Inc., Aug. 23, 2009, 1-4.

* cited by examiner

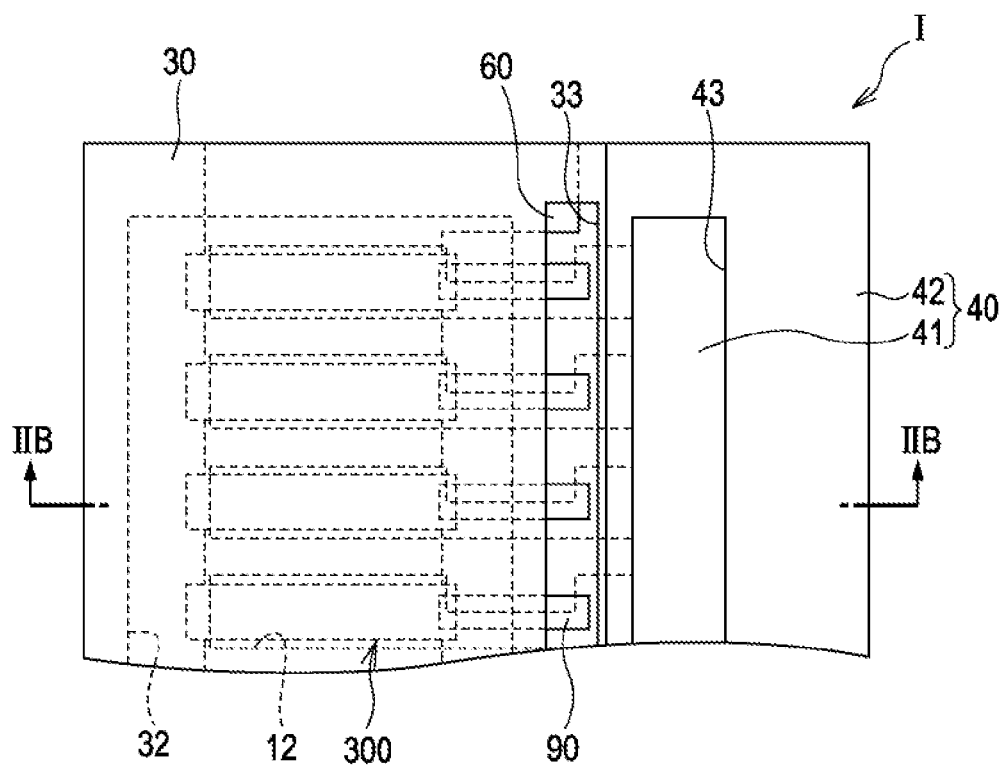
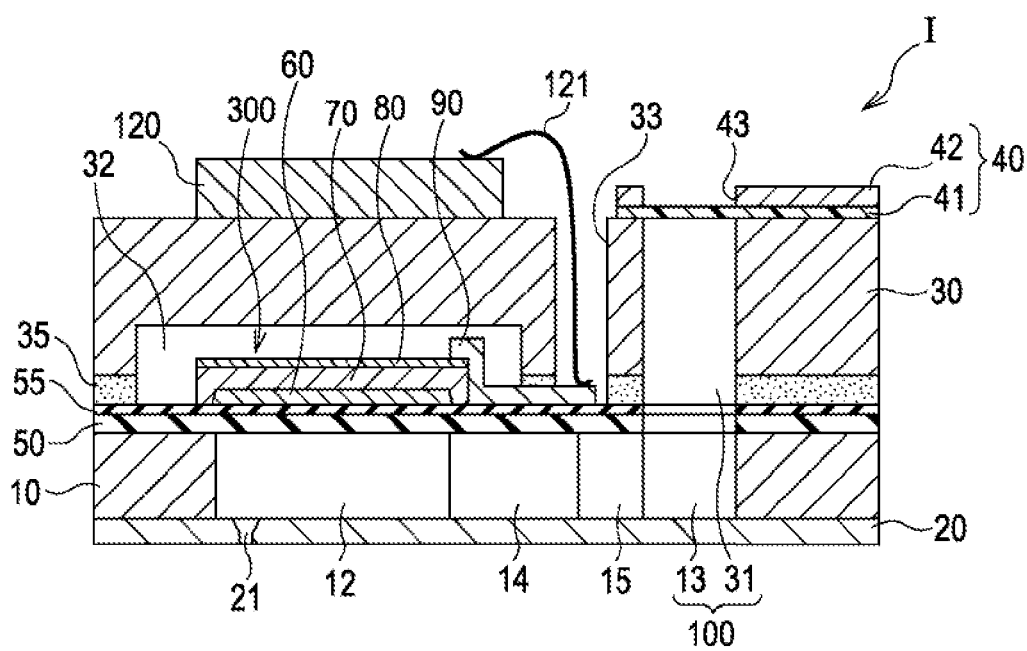

LIQUID-EJECTING HEAD, LIQUID-EJECTING APPARATUS, PIEZOELECTRIC ELEMENT, AND PIEZOELECTRIC MATERIAL

CROSS-REFERENCE TO RELATED APPLICATIONS

This application is a Continuation of U.S. patent application Ser. No. 12/914,233 filed Oct. 28, 2010 (which patent application is incorporated herein by reference in its entirety). U.S. patent application Ser. No. 12/914,233 claims the benefit of Japanese Patent Application No. 2009-252445 filed Nov. 2, 2009 (which is expressly incorporated herein by reference in its entirety), Japanese Patent Application No. 2010-052430 filed Mar. 9, 2010 (which also is expressly incorporated herein by reference in its entirety), and Japanese Patent Application No. 2010-115744 filed May 19, 2010 (which is also expressly incorporated herein by reference in its entirety).

BACKGROUND

1. Technical Field

The present invention relates to a liquid-ejecting head that includes a piezoelectric element, a liquid-ejecting apparatus, the piezoelectric element, and a piezoelectric material. The piezoelectric element includes a first electrode for altering the internal pressure of a pressure-generating chamber communicating with a nozzle opening, a piezoelectric layer, and a second electrode.

2. Related Art

One example of piezoelectric elements for use in liquid-ejecting heads is a piezoelectric layer between two electrodes. The piezoelectric layer is formed of a piezoelectric material having an electromechanical transfer function, such as a crystallized dielectric material. Such a piezoelectric element can be mounted on a liquid-ejecting head as an actuator in a flexural vibration mode. One representative example of liquid-ejecting heads is an ink jet print head. The ink jet print head has a diaphragm as part of a pressure-generating chamber, which communicates with a nozzle opening for discharging ink droplets. The diaphragm is deformed by a piezoelectric element to pressurize ink in the pressure-generating chamber, thereby discharging ink droplets from the nozzle opening. A piezoelectric element for use in such an ink jet print head can be produced by forming a uniform piezoelectric layer on the entire surface of a diaphragm by a film-forming technique and dividing the piezoelectric layer by lithography into pieces corresponding to each individual pressure-generating chamber.

The piezoelectric material used for such a piezoelectric element requires excellent piezoelectric characteristics (a large strain). One representative example of the piezoelectric material is lead zirconium titanate (PZT) (see JP-A-2001-223404). PZT is a ferroelectric substance. In ferroelectric substances, spontaneous polarization occurs unidirectionally, and the piezoelectric strain increases linearly with voltage applied. This facilitates the control of piezoelectric strain and the size of droplets discharged. Thus, PZT is suitable for use in actuators.

However, from the standpoint of environmental protection, there is a demand for a piezoelectric material with little or no lead. These problems are not confined to liquid-ejecting heads, including ink jet print heads, and occur in other piezoelectric elements.

SUMMARY

An advantage of some aspects of the invention is that it provides a liquid-ejecting head that includes a piezoelectric element formed of a ferroelectric substance and having a low environmental load, a liquid-ejecting apparatus, the piezoelectric element, and a piezoelectric material.

In accordance with one aspect of the invention, a liquid-ejecting head includes a pressure-generating chamber communicating with a nozzle opening, and a piezoelectric element that includes a first electrode, a piezoelectric layer disposed on the first electrode, and a second electrode disposed on the piezoelectric layer, wherein the piezoelectric layer contains a perovskite complex oxide containing Bi, La, Fe, and Mn and is ferroelectric.

Use of a piezoelectric material that contains a perovskite complex oxide containing Bi, La, Fe, and Mn and is ferroelectric can reduce the lead content and the environmental load and facilitates the control of piezoelectric strain. Thus, the liquid-ejecting head can include a piezoelectric element in which it is easy to control the size of droplets discharged.

In accordance with another aspect of the invention, a liquid-ejecting head includes a pressure-generating chamber communicating with a nozzle opening, and a piezoelectric element that includes a first electrode, a piezoelectric layer disposed on the first electrode, and a second electrode disposed on the piezoelectric layer, wherein the piezoelectric layer contains a complex oxide having the following general formula (1). The complex oxide having the following general formula (1) is a ferroelectric substance. Use of such a ferroelectric substance can reduce the lead content and the environmental load and facilitate the control of piezoelectric strain.

$$(Bi_{1-x}La_x)(Fe_{1-y}Mn_y)O_3 \qquad (1)$$

$(0.10 \leq x \leq 0.20,\ 0.01 \leq y \leq 0.09)$

In the general formula (1), x is preferably in the range of $0.17 \leq x \leq 0.20$, more preferably $0.19 \leq x \leq 0.20$. Such a composition has both an antiferroelectric phase and a ferroelectric phase. Thus, the piezoelectric element can produce a large strain.

In the general formula (1), y is preferably in the range of $0.01 \leq y \leq 0.05$. In this range, the piezoelectric layer has excellent insulating properties and can prevent dielectric breakdown of the liquid-ejecting head caused by an electric leakage.

Preferably, the piezoelectric layer has an X-ray diffraction pattern that includes both a diffraction peak assigned to a ferroelectric phase and a diffraction peak assigned to an antiferroelectric phase. A combination of an antiferroelectric phase and a ferroelectric phase can provide a piezoelectric element that can produce a large strain.

Preferably, the piezoelectric layer has an X-ray diffraction pattern that includes a diffraction peak of an $ABO_3$ structure at $45°<2\theta<50°$, and the diffraction peak of the $ABO_3$ structure has an $A_{AF}/A_F$ ratio of 0.1 or more. $A_F$ denotes the area intensity of a diffraction peak assigned to a ferroelectric phase, and $A_{AF}$ denotes the area intensity of a diffraction peak assigned to an antiferroelectric phase. This insures that the piezoelectric element can produce a large strain.

In accordance with another aspect of the invention, a liquid-ejecting apparatus includes a liquid-ejecting head according to any of the aspects described above. Use of such a liquid-ejecting head can reduce the lead content and the environmental load. In addition, the liquid-ejecting head includes a piezoelectric element that allows the piezoelectric strain to be easily controlled. Thus, the liquid-ejecting apparatus including the liquid-ejecting head has excellent discharge characteristics without adversely affecting the environment.

In accordance with still another aspect of the invention, a piezoelectric element includes a piezoelectric layer and a plurality of electrodes disposed on the piezoelectric layer, wherein the piezoelectric layer contains a perovskite complex oxide containing Bi, La, Fe, and Mn and is ferroelectric. Use of a piezoelectric material that contains a perovskite complex oxide containing Bi, La, Fe, and Mn and is ferroelectric can reduce the lead content and the environmental load and facilitates the control of piezoelectric strain.

In accordance with still another aspect of the invention, a piezoelectric element includes a piezoelectric layer and a plurality of electrodes disposed on the piezoelectric layer, wherein the piezoelectric layer contains a complex oxide having the following general formula (1). The complex oxide having the following general formula (1) is a ferroelectric substance. Use of such a ferroelectric substance can reduce the lead content and the environmental load and facilitate the control of piezoelectric strain.

$(Bi_{1-x},La_x)(Fe_{1-y},Mn_y)O_3$      (1)

$(0.10 \leq x \leq 0.20, 0.01 \leq y \leq 0.09)$

In accordance with still another aspect of the invention, a piezoelectric material contains a perovskite complex oxide containing Bi, La, Fe, and Mn and is ferroelectric. The piezoelectric material can reduce the lead content and the environmental load and facilitate the control of piezoelectric strain.

In accordance with still another aspect of the invention, a piezoelectric material contains a perovskite complex oxide having the following general formula (1). The perovskite complex oxide having the following general formula (1) is a ferroelectric substance. Use of such a ferroelectric substance can reduce the lead content and the environmental load and facilitate the control of piezoelectric strain.

$(Bi_{1-x},La_x)(Fe_{1-y},Mn_y)O_3$      (1)

$(0.10 \leq x \leq 0.20, 0.01 \leq y \leq 0.09)$

BRIEF DESCRIPTION OF THE DRAWINGS

The invention will be described with reference to the accompanying drawings, wherein like numbers reference like elements.

FIG. 2A is a plan view of the print head according to the first embodiment.

FIG. 2B is a cross-sectional view of the print head taken along the line IIB-IIB of FIG. 2A.

DESCRIPTION OF EXEMPLARY EMBODIMENTS

First Embodiment

Figure 1:
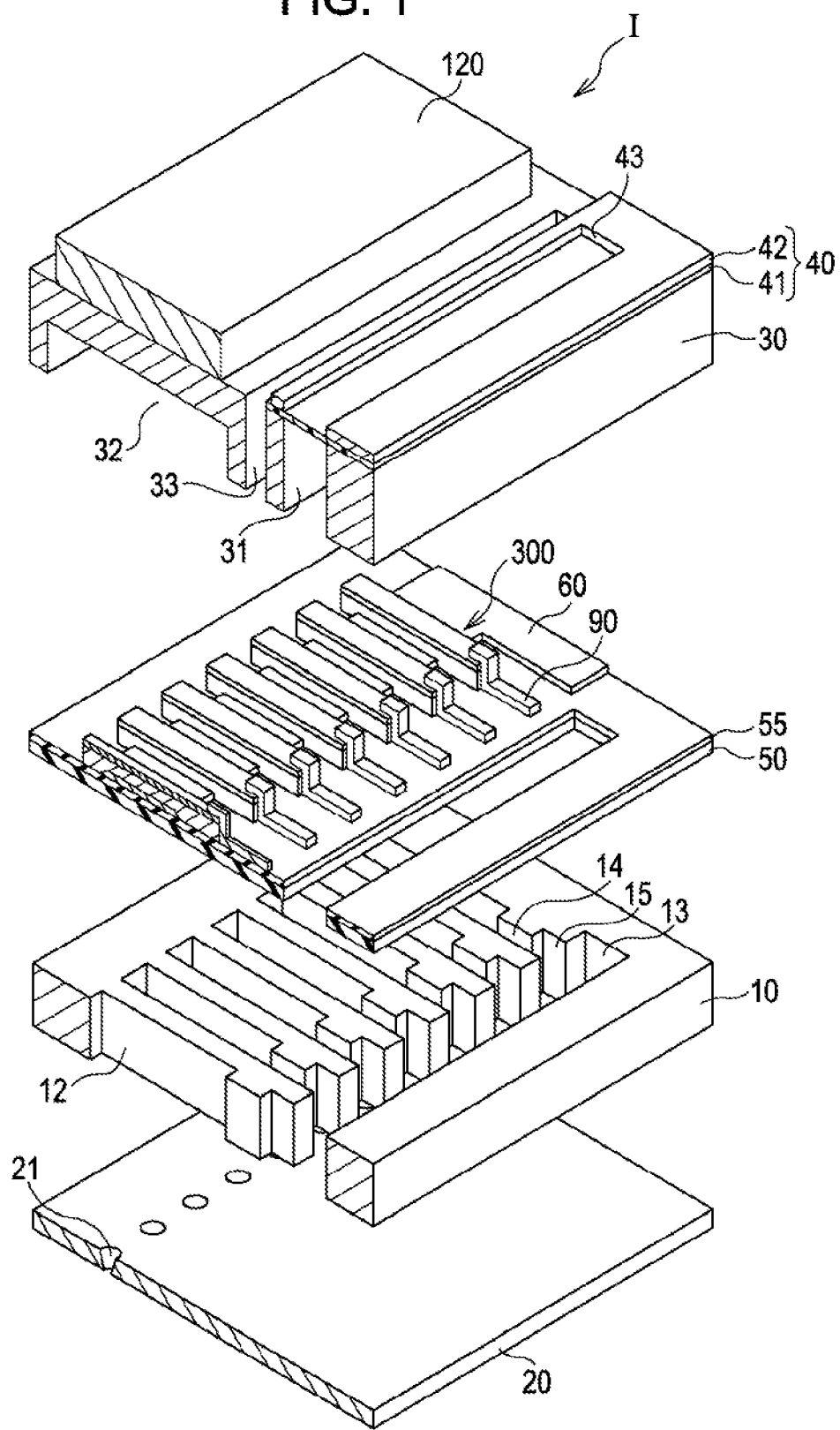
FIG. 1 is a schematic exploded perspective view of a print head according to a first embodiment.
Figure 3:
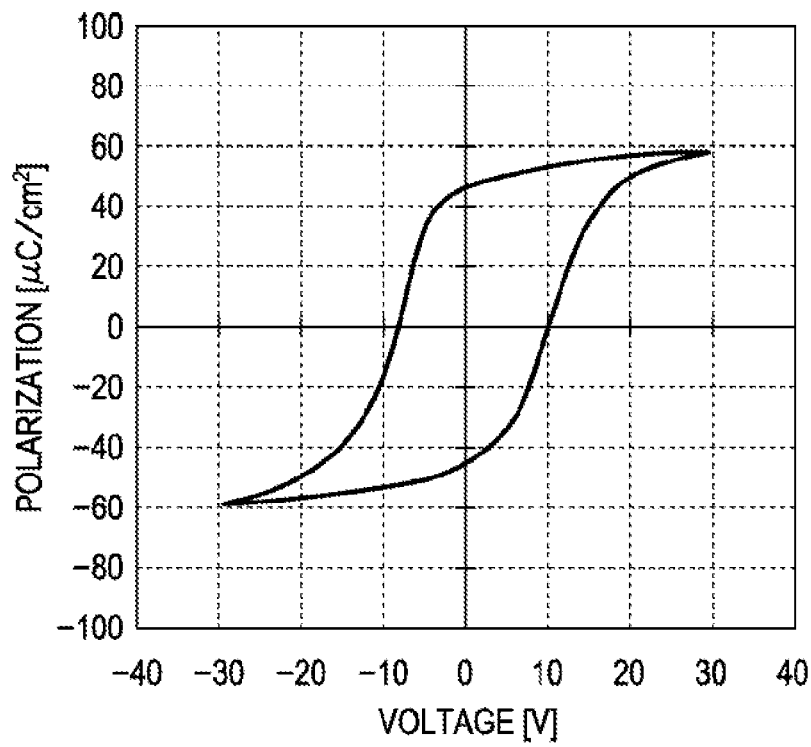
FIG. 3 is a graph showing a P-V curve according to Example 1.
Figure 4:
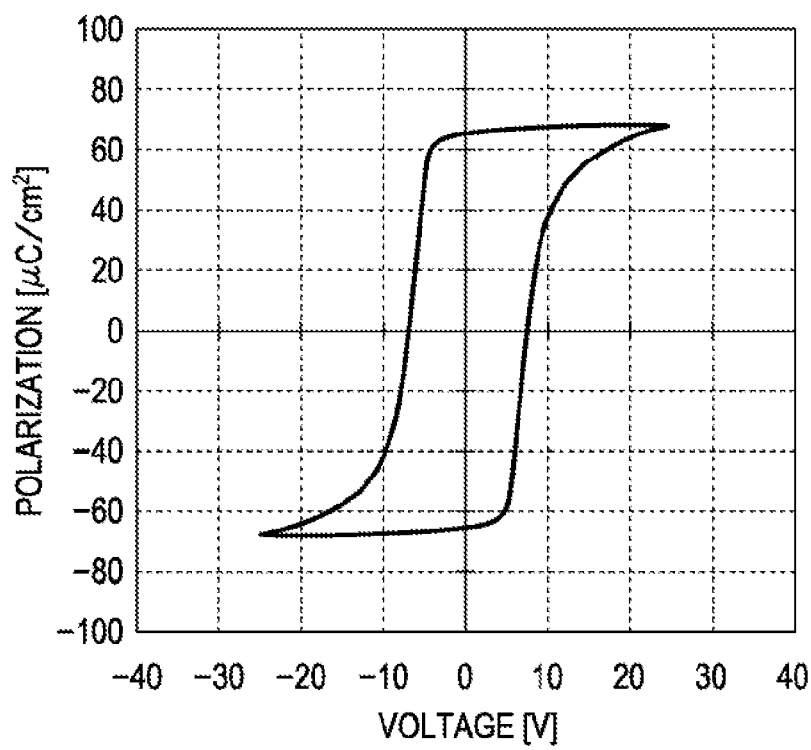
FIG. 4 is a graph showing a P-V curve according to Example 2.
Figure 5:
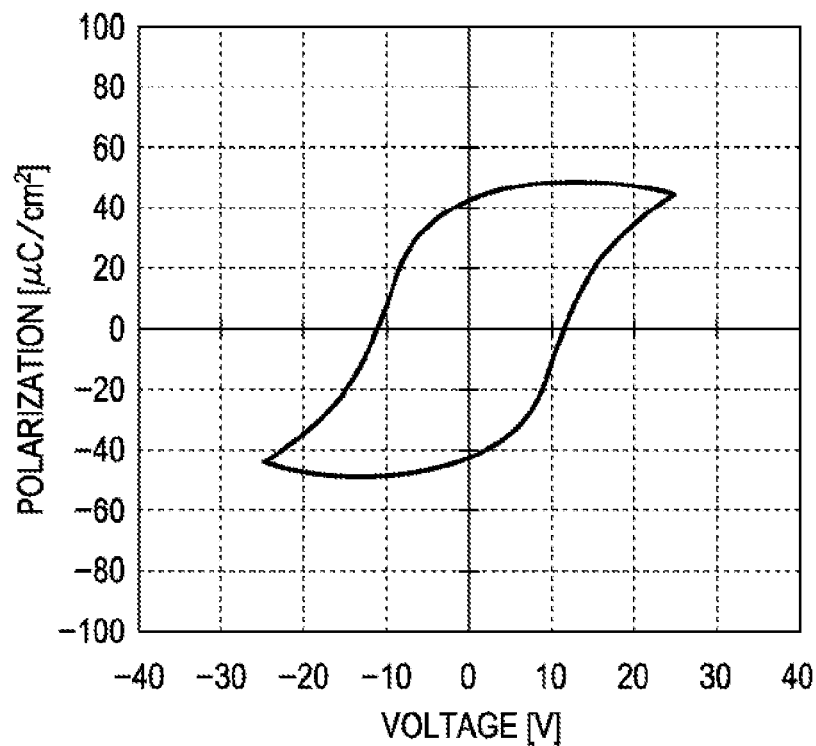
FIG. 5 is a graph showing a P-V curve according to Example 3.
Figure 6:
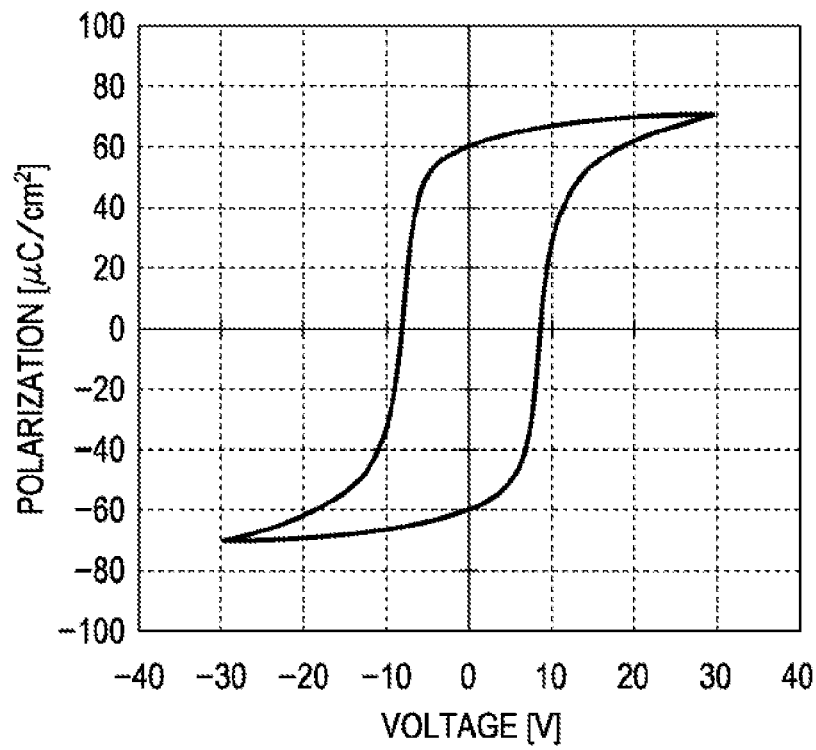
FIG. 6 is a graph showing a P-V curve according to Example 4.
Figure 7:
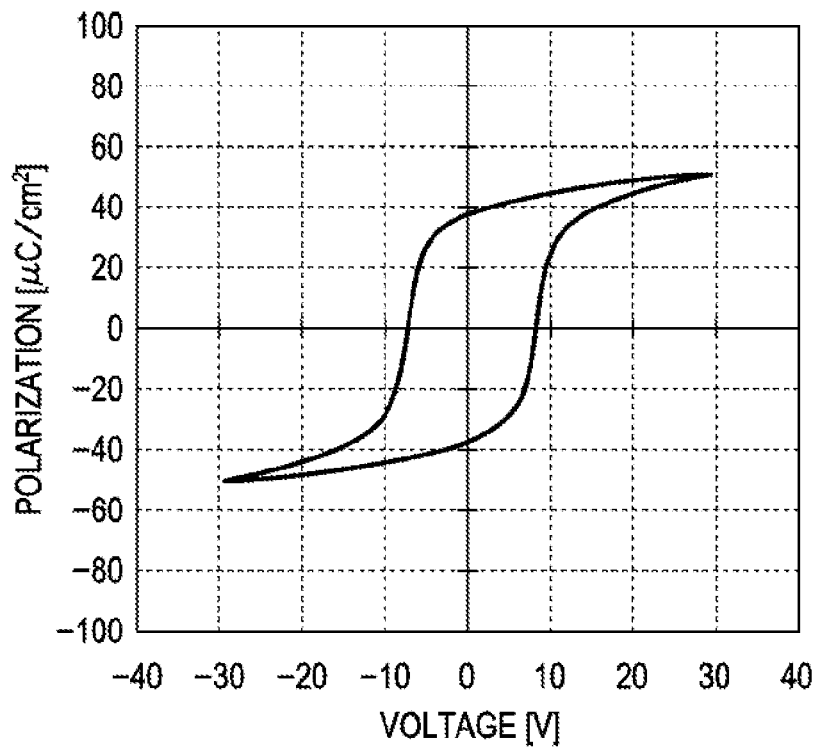
FIG. 7 is a graph showing a P-V curve according to Example 5.
Figure 8:
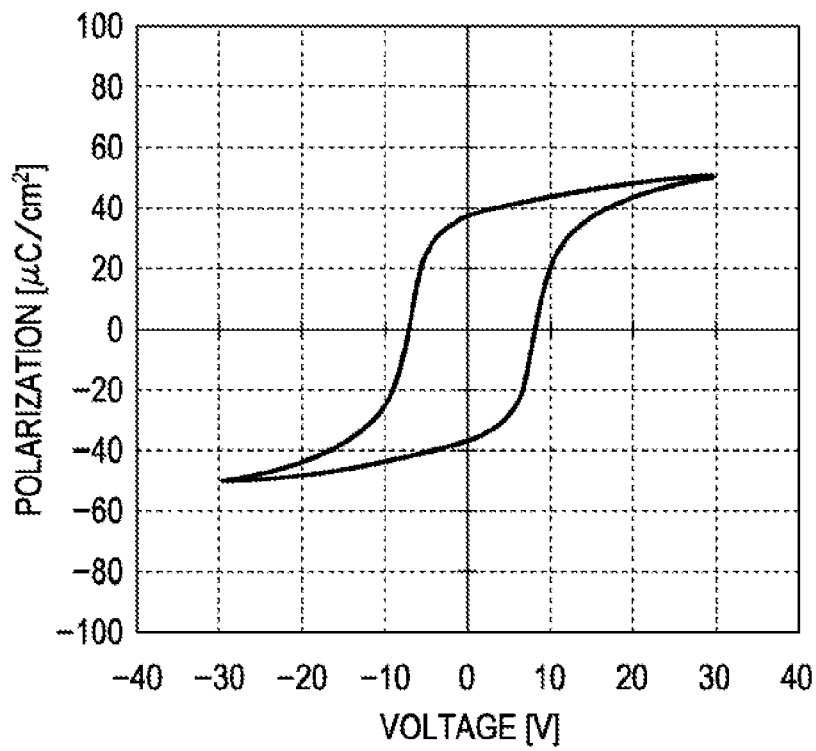
FIG. 8 is a graph showing a P-V curve according to Example 6
Figure 9:
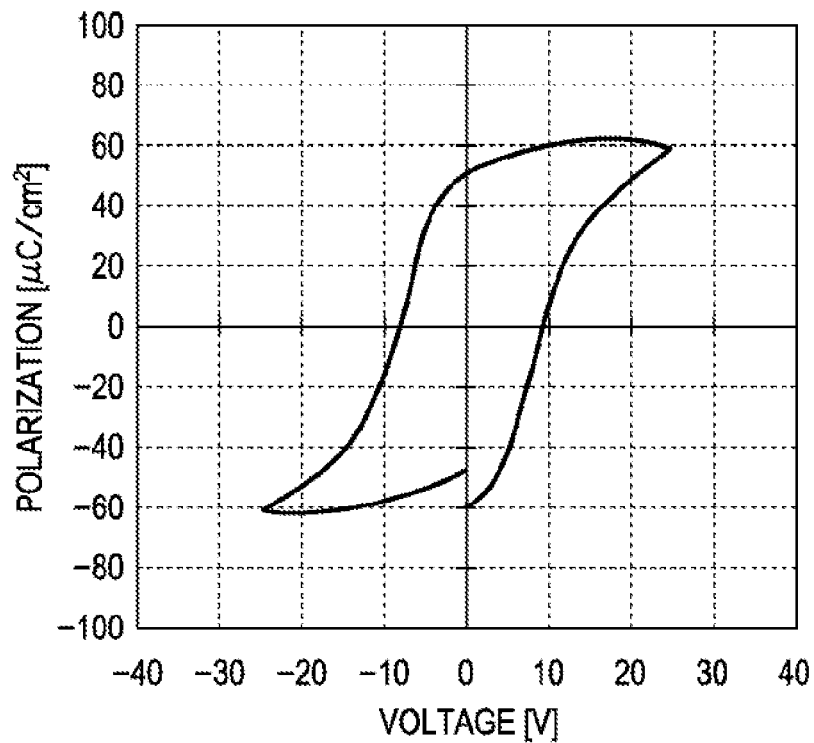
FIG. 9 is a graph showing a P-V curve according to Example 7.
Figure 10:
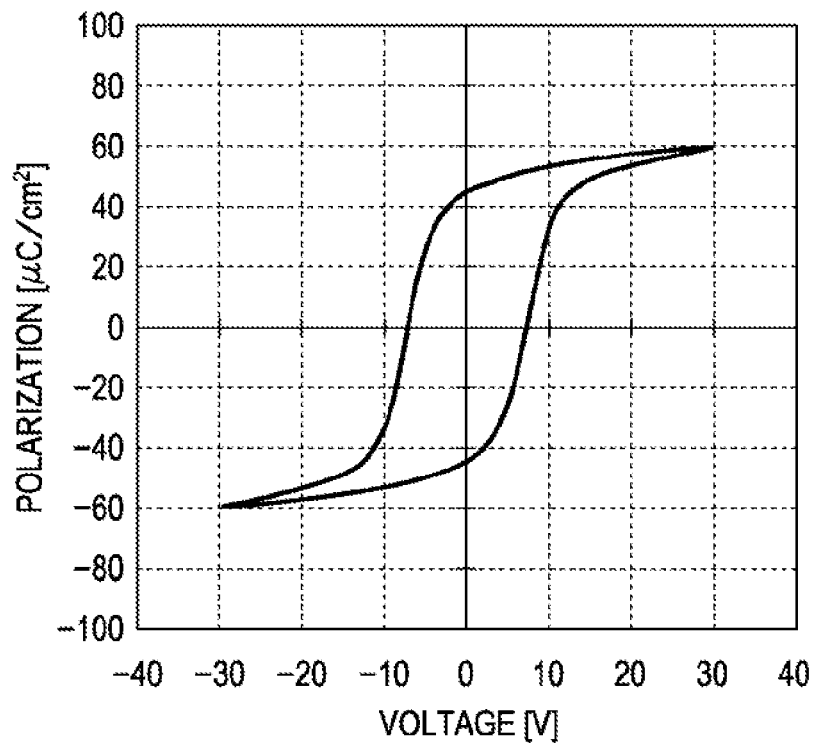
FIG. 10 is a graph showing a P-V curve according to Example 8.
Figure 11:
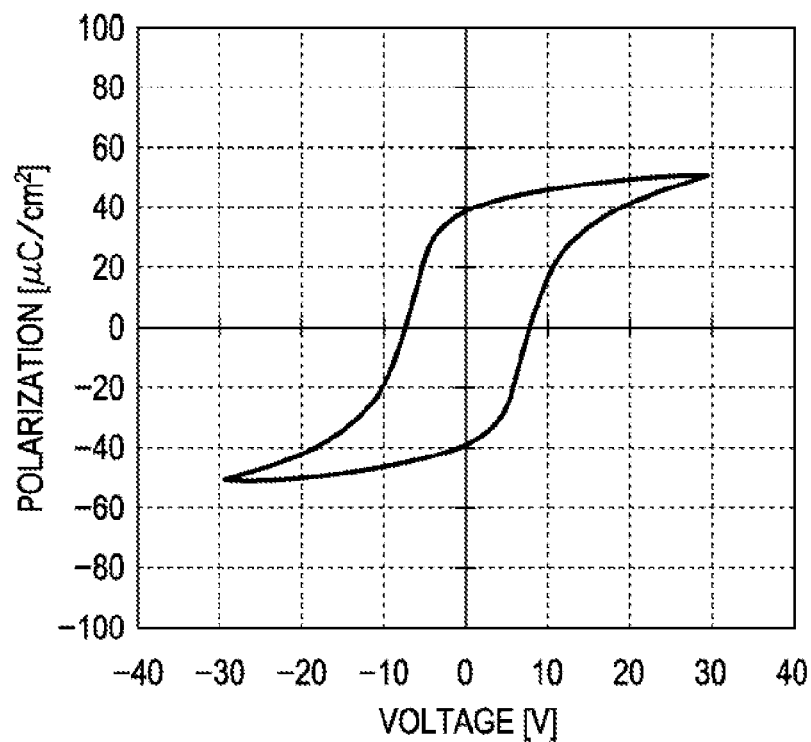
FIG. 11 is a graph showing a P-V curve according to Example 9.
Figure 12:
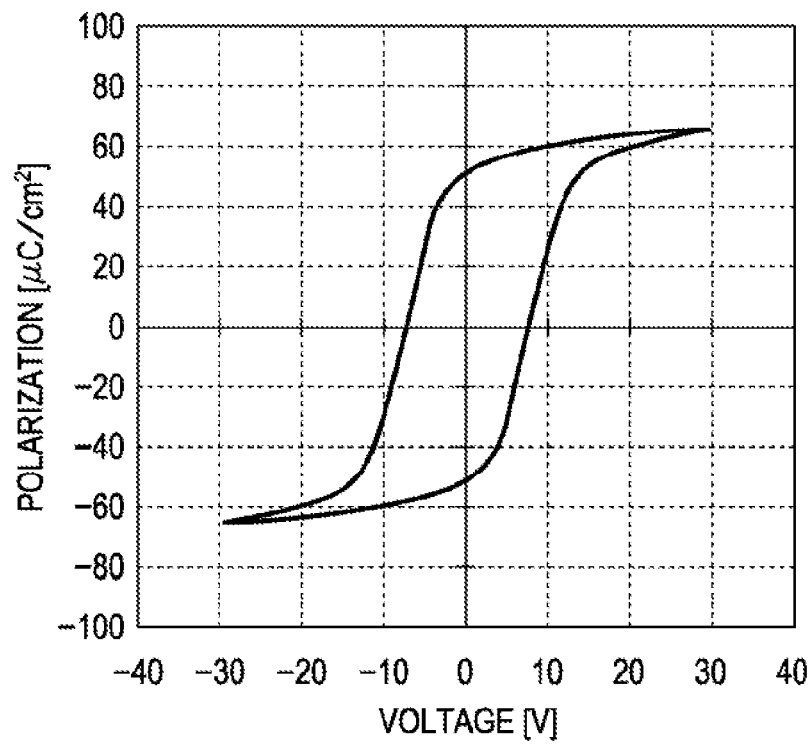
FIG. 12 is a graph showing a P-V curve according to Example 10.
Figure 13:
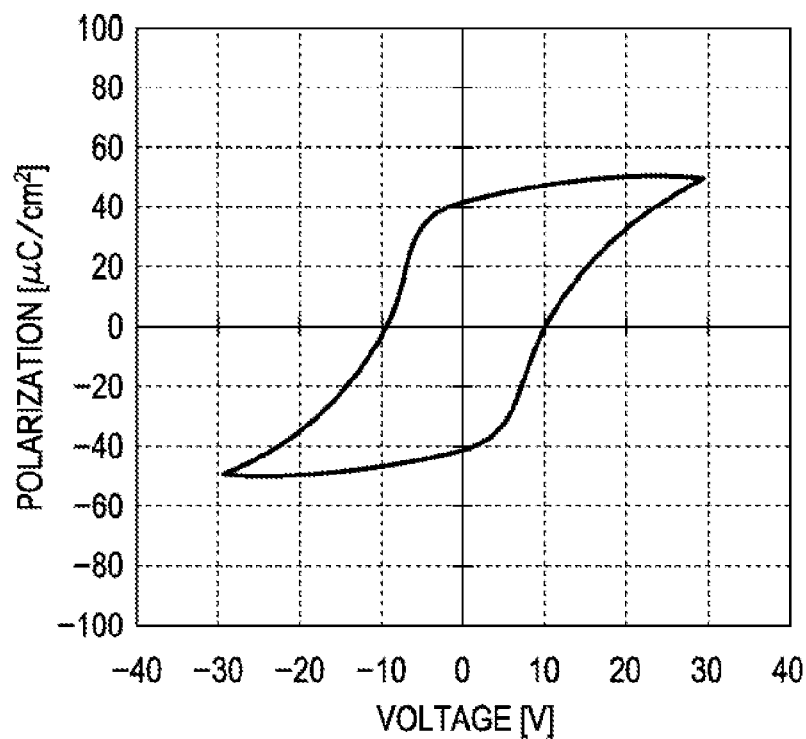
FIG. 13 is a graph showing a P-V curve according to Example 11.

FIG. 1 is an exploded perspective view of an ink jet print head according to a first embodiment of the invention. This ink jet print head is an example of a liquid-ejecting head. FIG. 2A is a plan view of the ink jet print head according to the first embodiment. FIG. 2B is a cross-sectional view of the ink jet print head taken along the line IIB-IIB of FIG. 2A.

As illustrated in FIGS. 1 and 2, a flow-passage-forming substrate 10 according to the present embodiment is a silicon single crystal substrate. A silicon dioxide elastic film 50 is disposed on the flow-passage-forming substrate 10.

The flow-passage-forming substrate 10 includes a plurality of pressure-generating chambers 12 juxtaposed to each other in the width direction. The flow-passage-forming substrate 10 further includes a communication portion 13 outside the pressure-generating chambers 12 in the longitudinal direction. The communication portion 13 is in communication with the pressure-generating chambers 12 through corresponding ink feed channels 14 and communication paths 15. The communication portion 13 in communication with a reservoir portion 31 in a protective substrate described below constitutes part of a reservoir, which is a common ink chamber of the pressure-generating chambers 12. The ink feed channels 14 have a smaller width than the pressure-generating chambers 12, producing a constant flow resistance against ink flowing from the communication portion 13 to the pressure-generating chambers 12. While each of the flow passages is narrowed at one side thereof in the present embodiment, each of the flow passages may be narrowed at both sides thereof to form the ink feed channels 14. Alternatively, instead of reducing the width of the flow passages, the thickness of the flow passages may be reduced to form the ink feed channels 14. Thus, the flow-passage-forming substrate 10 includes liquid flow passages, which are composed of the pressure-generating chambers 12, the communication portion 13, the ink feed channels 14, and the communication paths 15.

The opening surface of the flow-passage-forming substrate 10 is attached to a nozzle plate 20 with an adhesive, a heat-seal film, or the like. The nozzle plate 20 has nozzle openings 21 near the ends of the pressure-generating chambers 12 opposite the ink feed channels 14. The nozzle plate 20 is formed of glass ceramic, a silicon single crystal, or stainless steel, for example.

As described above, the elastic film 50 is disposed opposite the opening surface of the flow-passage-forming substrate 10. An insulator film 55 formed of, for example, zirconium oxide is formed on the elastic film 50.

A piezoelectric element 300 is disposed on the insulator film 55 and includes a first electrode 60, a piezoelectric layer 70, and a second electrode 80. The piezoelectric layer 70 has a thickness of 2 μm or less, preferably in the range of 0.3 to 1.5 μm. A titanium oxide layer may be disposed between the piezoelectric element 300 and the insulator film 55 to improve the adhesion therebetween. In general, one of the electrodes of the piezoelectric element 300 serves as a common electrode, and the other electrode and the piezoelectric layer 70 are patterned for each of the pressure-generating chambers 12. In the present embodiment, the first electrode 60 serves as the common electrode of the piezoelectric elements 300 and the second electrode 80 serves as an individual electrode of the corresponding piezoelectric element 300. However, for the convenience of a drive circuit or wiring, the first electrode 60 may serve as the individual electrode and the second electrode 80 may serve as the common electrode. A combination of a piezoelectric element 300 and a diaphragm is herein referred to as an actuator. The diaphragm can be deformed by the operation of the piezoelectric element 300. Although the elastic film 50, the insulator film 55, and the first electrode 60 function as the diaphragm in the present embodiment, the diaphragm is not limited to this structure. For example, the first electrode 60 alone may function as the diaphragm. Alternatively, the piezoelectric element 300 may function as the diaphragm.

The piezoelectric layer 70 is formed of a perovskite complex oxide containing Bi, La, Fe, and Mn and is ferroelectric. More specifically, for example, the piezoelectric layer 70 is formed of an $ABO_3$ complex oxide having the following general formula (1). As shown in the examples described below, the $ABO_3$ complex oxide having the following general formula (1) is a ferroelectric substance.

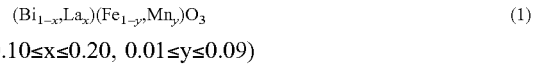

(0.10≤x≤0.20, 0.01≤y≤0.09)

In the perovskite $ABO_3$ structure, the A sites have oxygen atoms in 12-fold coordination, and the B sites have oxygen atoms in 6-fold coordination, forming an octahedron. Bi and La are located at the A sites, and Fe and Mn are located at the B sites.

Use of such a ferroelectric $ABO_3$ complex oxide containing Bi, La, Fe, and Mn in the piezoelectric layer can reduce the lead content and the environmental load and facilitate the control of piezoelectric strain and the control of ink droplet size. As shown in the examples and comparative examples described below, depending on the composition, the $ABO_3$ complex oxide containing Bi, La, Fe, and Mn may be a ferroelectric substance or an antiferroelectric substance.

An antiferroelectric substance includes adjacent dipoles oriented in antiparallel directions and can undergo electric-field-induced phase transition above a certain voltage. A piezoelectric layer formed of such an antiferroelectric substance can produce a larger strain than a piezoelectric layer formed of a ferroelectric substance. However, the piezoelectric layer formed of an antiferroelectric substance cannot be driven below a certain voltage. In addition, the piezoelectric strain does not change linearly with voltage. The term "electric-field-induced phase transition" means phase transition induced by an electric field and includes phase transition from an antiferroelectric phase to a ferroelectric phase and phase transition from a ferroelectric phase to an antiferroelectric phase. The term "ferroelectric phase" means that spontaneous polarization occurs unidirectionally. The term "antiferroelectric phase" means that adjacent dipoles are oriented in antiparallel directions. For example, in phase transition from an antiferroelectric phase to a ferroelectric phase, some adjacent dipoles oriented in antiparallel directions in the antiferroelectric phase are inverted such that the dipoles are oriented unidirectionally. Such electric-field-induced phase transition expands or contracts lattices to produce a strain (electric-field-induced phase transition strain). A substance that can undergo electric-field-induced phase transition is an antiferroelectric substance. Thus, in an antiferroelectric substance, some adjacent dipoles oriented in antiparallel directions in the absence of an electric field are inverted such that the dipoles are oriented unidirectionally upon the application of an electric field. In a P-V curve showing the amount of polarization P of an antiferroelectric substance as a function of voltage V, the antiferroelectric substance has double hysteresis loops in the positive electric field direction and the negative electric field direction. In regions where the amount of polarization changes drastically, there is phase transition from a ferroelectric phase to an antiferroelectric phase and from an antiferroelectric phase to a ferroelectric phase.

Unlike the antiferroelectric substance, a ferroelectric substance does not have a double hysteresis in a P-V curve. In the ferroelectric substance, spontaneous polarization occurs unidirectionally, and the piezoelectric strain increases linearly with voltage applied. Thus, the ferroelectric substance facilitates the control of piezoelectric strain and the control of droplet size, and a single piezoelectric element can generate both a small amplitude vibration (microvibration) and a large amplitude vibration, which generates a large excluded volume.

In the X-ray diffraction measurement of the piezoelectric layer 70, the diffraction pattern preferably includes both a diffraction peak assigned to a ferroelectric phase and a diffraction peak assigned to an antiferroelectric phase. More preferably, the X-ray diffraction pattern includes a diffraction peak of an $ABO_3$ structure at 45°<2θ<50°, and the diffraction peak of the $ABO_3$ structure has an $A_{AF}/A_F$ ratio of 0.1 or more. $A_F$ denotes the area intensity of a diffraction peak assigned to a ferroelectric phase, and $A_{AF}$ denotes the area intensity of a diffraction peak assigned to an antiferroelectric phase. The piezoelectric layer 70 that includes both a diffraction peak assigned to a ferroelectric phase and a diffraction peak assigned to an antiferroelectric phase, that is, the piezoelectric layer 70 that includes a morphotropic phase boundary (MPB) between the antiferroelectric phase and the ferroelectric phase can provide a piezoelectric element that can produce a large strain.

In the piezoelectric layer 70, x is preferably in the range of $0.17 \leq x \leq 0.20$, more preferably $0.19 \leq x \leq 0.20$, in the general formula (1). In these ranges, as shown in the examples described below, the X-ray diffraction pattern includes both a diffraction peak assigned to a ferroelectric phase and a diffraction peak assigned to an antiferroelectric phase, showing the coexistence of the antiferroelectric phase and the ferroelectric phase. The MPB between the antiferroelectric phase and the ferroelectric phase can provide a piezoelectric element that can produce a large strain. When y is in the range of $0.01 \leq y \leq 0.05$, the piezoelectric layer 70 also has high leakage resistance.

The piezoelectric element 300 can be formed on the flow-passage-forming substrate 10 by any method, including the following method. First, a silicon dioxide ($SiO_2$) film is formed as the elastic film 50 on a silicon wafer used as the flow-passage-forming substrate 10. A zirconium oxide insulator film 55 is then formed on the elastic film 50 (silicon dioxide film).

If necessary, a titanium oxide layer is formed on the insulator film 55. A platinum or iridium first electrode 60 is then formed on the entire surface by sputtering and is patterned.

A piezoelectric layer 70 is then formed on the first electrode 60. The piezoelectric layer 70 may be formed by any method, including metal-organic decomposition (MOD). In MOD, an organometallic compound dissolved or dispersed in a solvent is applied to the first electrode 60, is dried, and is fired at a high temperature to form the piezoelectric layer 70 formed of a metal oxide. The piezoelectric layer 70 may also be formed by a sol-gel method, laser ablation, sputtering, pulse laser deposition (PLD), CVD, or aerosol deposition.

For example, a sol or MOD solution (precursor solution) that contains an organometallic compound, more specifically, an organometallic compound containing bismuth, lanthanum, iron, and manganese at a predetermined ratio is applied to the first electrode 60 by spin coating to form a piezoelectric precursor film (a coating step).

The precursor solution is prepared by mixing organometallic compounds containing bismuth, lanthanum, iron, or manganese such that the metals are contained at a desired molar ratio, and dissolving or dispersing the mixture in an organic solvent, such as an alcohol. Examples of the organometallic compounds containing bismuth, lanthanum, iron, or manganese include metal alkoxides, organic acid salts, and β-diketone complexes. One example of the organometallic compound containing bismuth is bismuth 2-ethylhexanoate. An exemplary organometallic compound containing lanthanum is lanthanum 2-ethylhexanoate. An exemplary organometallic compound containing iron is iron 2-ethylhexanoate. An exemplary organometallic compound containing manganese is manganese 2-ethylhexanoate.

The piezoelectric precursor film is then heated at a predetermined temperature for a predetermined period of time for drying (a drying step). The dried piezoelectric precursor film is then heated at a predetermined temperature for a predetermined period of time for degreasing (a degreasing step). The term "degreasing", as used herein, means that organic components contained in the piezoelectric precursor film are removed as $NO_2$, $CO_2$, and/or $H_2O$, for example.

The piezoelectric precursor film is then heated at a predetermined temperature, for example, approximately in the range of 600° C. to 700° C., for a predetermined period of time to form a piezoelectric film by crystallization (a sintering step). Examples of a heater used in the drying step, the degreasing step, and the sintering step include a hot plate and a rapid thermal annealing (RTA) apparatus. RTA involves heating by infrared lamp irradiation.

Depending on the desired film thickness, the coating step, the drying step, the degreasing step, and optionally the sintering step may be performed more than once to form a piezoelectric layer composed of a plurality of piezoelectric films.

After the formation of the piezoelectric layer 70, a second electrode 80, for example, formed of a metal, such as platinum, is formed on the piezoelectric layer 70. The piezoelectric layer 70 and the second electrode 80 are then simultaneously patterned to form the piezoelectric element 300.

If necessary, the piezoelectric element 300 may be post-annealed at a temperature in the range of 600° C. to 700° C. Post-annealing can provide a good interface between the piezoelectric layer 70 and the first electrode 60 or the second electrode 80 and improve the crystallinity of the piezoelectric layer 70.

EXAMPLES

The invention will be further described in the following examples. However, the invention is not limited to these examples.

Example 1

A silicon dioxide film having a thickness of 400 nm was formed on a (100)-oriented silicon substrate by thermal oxidation. A titanium film having a thickness of 40 nm was formed on the silicon dioxide film by RF sputtering and was then thermally oxidized to form a titanium oxide film. A platinum film having a thickness of 150 nm was formed on the titanium oxide film by ion sputtering and vapor deposition to form a (111)-oriented first electrode 60.

A piezoelectric layer was formed on the first electrode 60 by spin coating in the following manner. First, solutions of bismuth 2-ethylhexanoate, lanthanum 2-ethylhexanoate, iron 2-ethylhexanoate, or manganese 2-ethylhexanoate in xylene and octane were mixed at a predetermined ratio to prepare a precursor solution. The precursor solution was dropped on the substrate on which the titanium oxide film and the first electrode were formed, and the substrate was rotated at 1500 rpm to form a piezoelectric precursor film (a coating step). Drying and degreasing were then performed at 350° C. for 3 minutes (a drying and degreasing step). After the coating step and the drying and degreasing step were performed three times, sintering was performed by rapid thermal annealing (RTA) at 650° C. for 1 minute (a sintering step). The three cycles of the coating step and the drying and degreasing step and the single sintering step were performed four times (12 coating steps in total). Sintering by RTA at 650° C. for 10 minutes yielded a piezoelectric layer 70 having a thickness of 350 nm.

A platinum film having a thickness of 100 nm was formed by DC sputtering as a second electrode 80 on the piezoelectric layer 70. Sintering by RTA at 650° C. for 10 minutes yielded a piezoelectric element 300. The piezoelectric element 300 included the piezoelectric layer 70 formed of an $ABO_3$ complex oxide having the general formula (1) in which x=0.10 and y=0.03.

Examples 2 to 11 and Comparative Examples 1 to 7

Piezoelectric elements 300 were formed in the same way as in Example 1 except that solutions of bismuth 2-ethylhexanoate, lanthanum 2-ethylhexanoate, iron 2-ethylhexanoate, or manganese 2-ethylhexanoate in xylene and octane were mixed at different ratios to form piezoelectric layers 70 formed of complex oxides having the general formula (1) in which x and y were shown in Table 1. In Examples 5, 6, and 9, a silicon dioxide film having a thickness of 1030 nm was formed on a (110)-oriented silicon substrate by thermal oxidation. A zirconium oxide layer having a thickness of 400 nm, a titanium layer having a thickness of 20 nm, and a platinum layer having a thickness of 130 nm were stacked on the silicon dioxide film by DC sputtering to form a (111)-oriented platinum electrode. The orientation of the substrate and the presence of the titanium oxide film did not affect the characteristics of the piezoelectric layer 70.

TABLE 1

|  | x | y |
|---|---|---|
| Example 1 | 0.10 | 0.03 |
| Example 2 | 0.10 | 0.05 |
| Example 3 | 0.10 | 0.09 |
| Example 4 | 0.14 | 0.05 |
| Example 5 | 0.17 | 0.03 |
| Example 6 | 0.18 | 0.03 |
| Example 7 | 0.20 | 0.01 |
| Example 8 | 0.20 | 0.02 |
| Example 9 | 0.19 | 0.03 |
| Example 10 | 0.19 | 0.04 |
| Example 11 | 0.19 | 0.05 |
| Comparative Example 1 | 0.21 | 0.03 |
| Comparative Example 2 | 0.24 | 0.05 |
| Comparative Example 3 | 0.29 | 0.05 |
| Comparative Example 4 | 0.48 | 0.05 |
| Comparative Example 5 | 0.20 | 0.00 |
| Comparative Example 6 | 0.10 | 0.00 |
| Comparative Example 7 | 0.00 | 0.00 |

Test Example 1

The relationship between the amount of polarization (P) and voltage (V) for the piezoelectric elements 300 according to Examples 1 to 11 and Comparative Examples 1 to 7 was determined using a 25- or 30-V triangular wave at a frequency of 1 kHz in a ferroelectric test system "FCE-1A" manufactured by Toyo Co. using an electrode pattern of $\phi$=400 μm. FIGS. 3 to 17 show the results. Comparative Examples 5 to 7 had too much leakage to determine the relationship and could not be used as piezoelectric materials.

FIGS. 3 to 13 shows that Examples 1 to 11 had a hysteresis loop characteristic of a ferroelectric substance. Thus, in Examples 1 to 11, the piezoelectric strain increases linearly with voltage applied and is easy to control.

Figure 14:
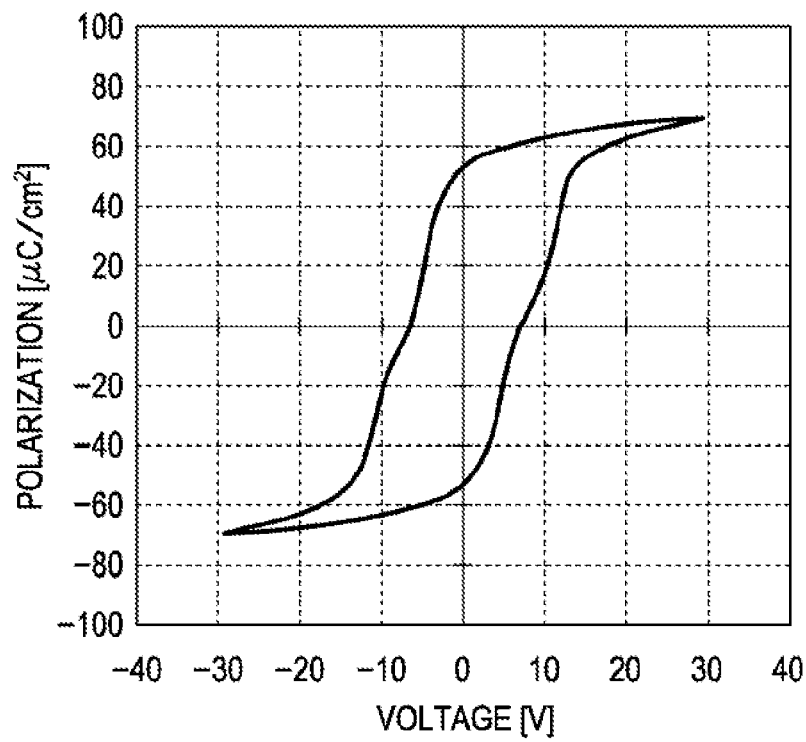
FIG. 14 is a graph showing a P-V curve according to Comparative Example 1.
Figure 15:
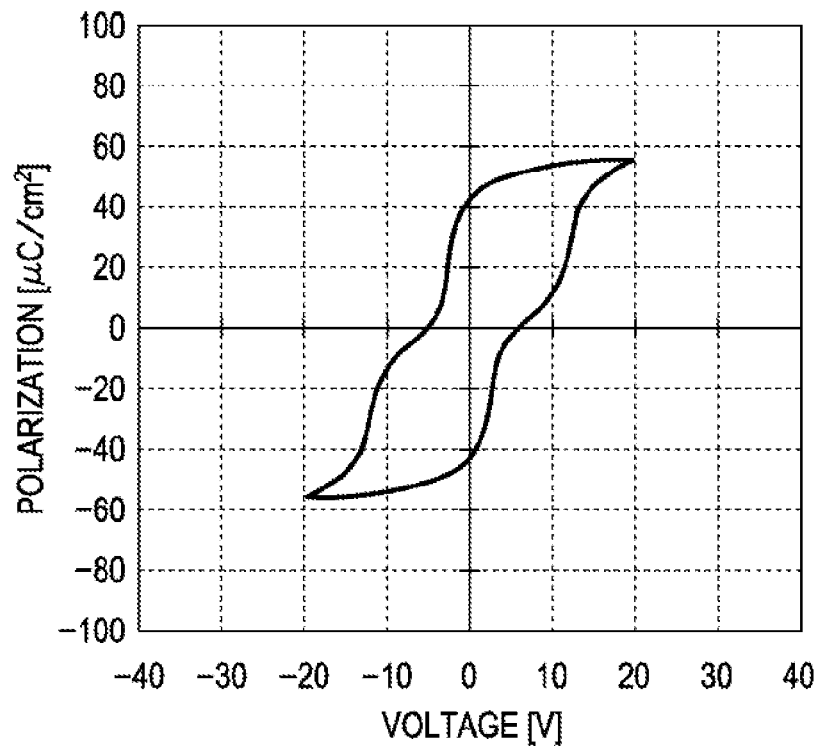
FIG. 15 is a graph showing a P-V curve according to Comparative Example 2.
Figure 16:
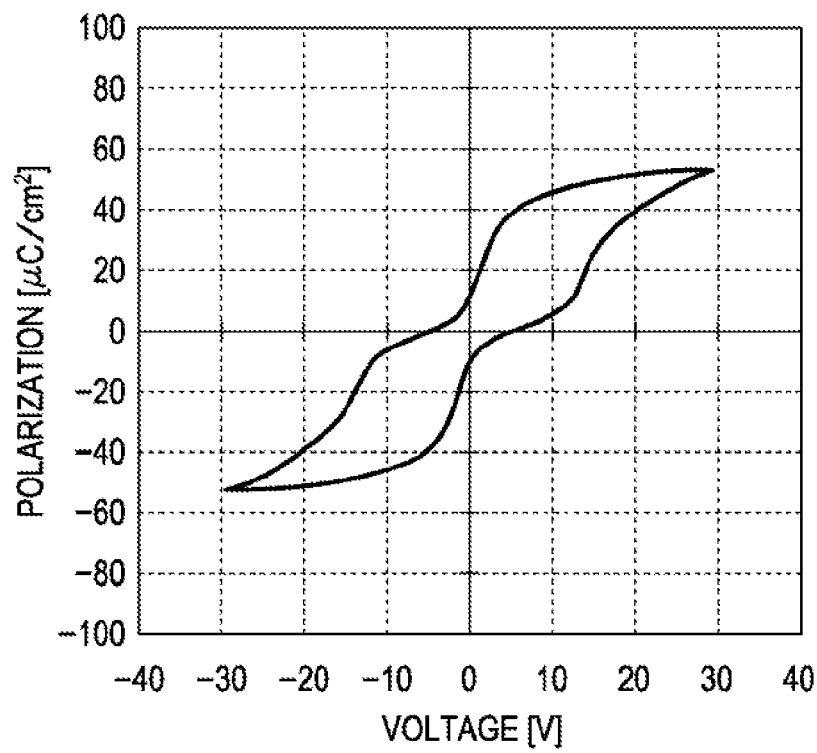
FIG. 16 is a graph showing a P-V curve according to Comparative Example 3.
Figure 17:
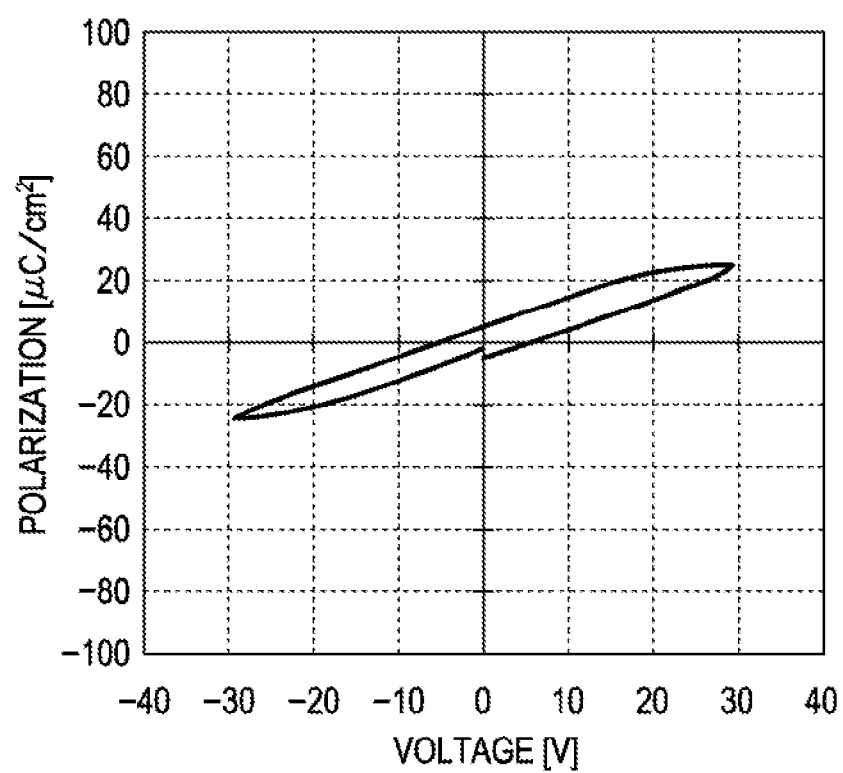
FIG. 17 is a graph showing a P-V curve according to Comparative Example 4.

As shown in FIGS. 14 to 16, Comparative Examples 1 to 3, which had x and y outside the ranges of $0.10 \leq x \leq 0.20$ and $0.01 \leq y \leq 0.09$ in the general formula (1), were antiferroelectric substances having double hysteresis characteristic of an antiferroelectric substance in the positive electric field direction and the negative electric field direction. As shown in FIG. 17, Comparative Example 4 was a paraelectric material. Comparative Examples 5 to 7 could not be used as a piezoelectric material because of excessive leakage, as described above. Thus, all of these Comparative Examples were not ferroelectric.

Examples 1 and 2 and Examples 4 to 11 with $0.01 \leq y \leq 0.05$ in the general formula (1) had particularly high leakage resistance.

Test Example 2

Figure 18:
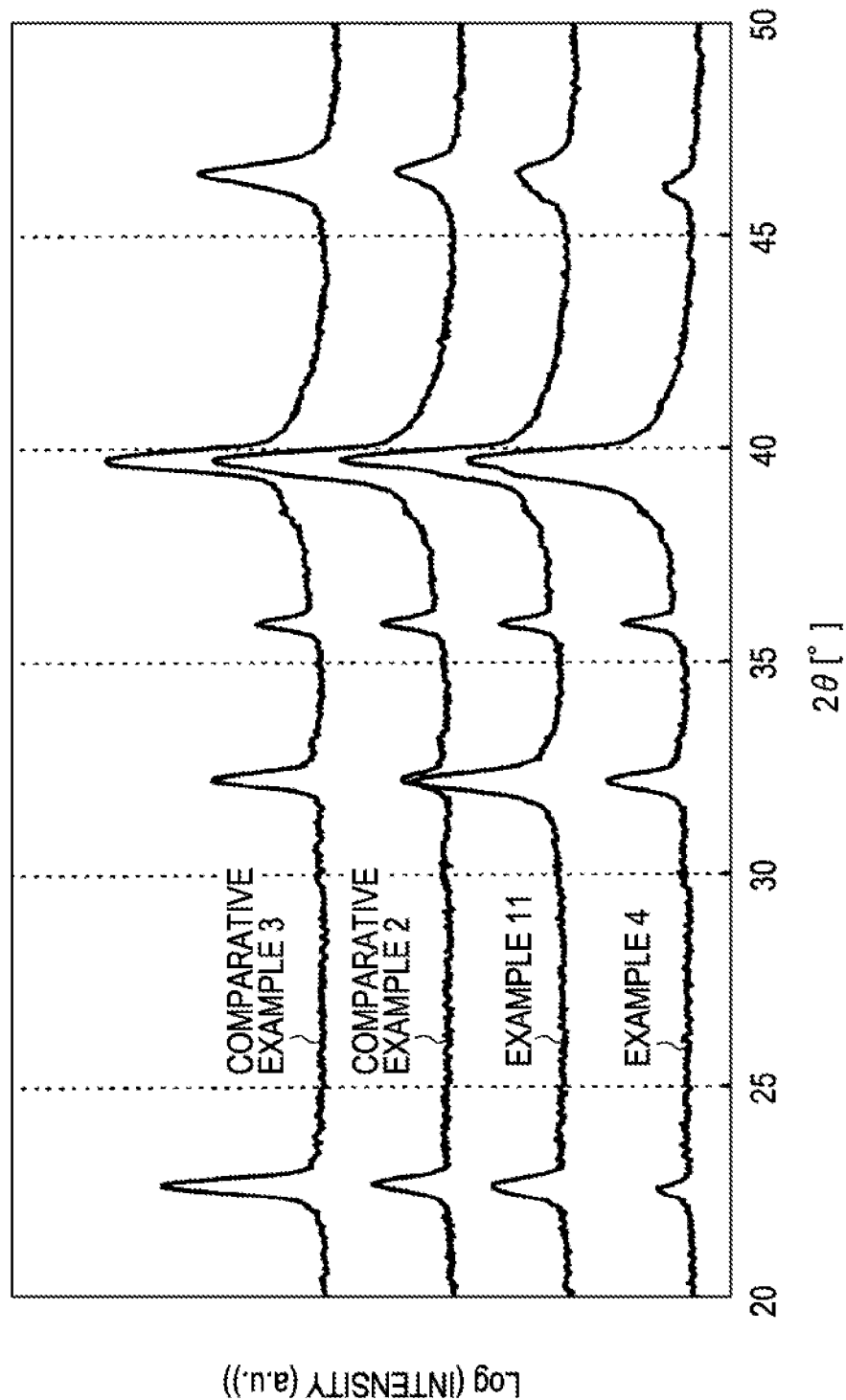
FIG. 18 is a graph showing an X-ray diffraction pattern according to Test Example 2.
Figure 19:
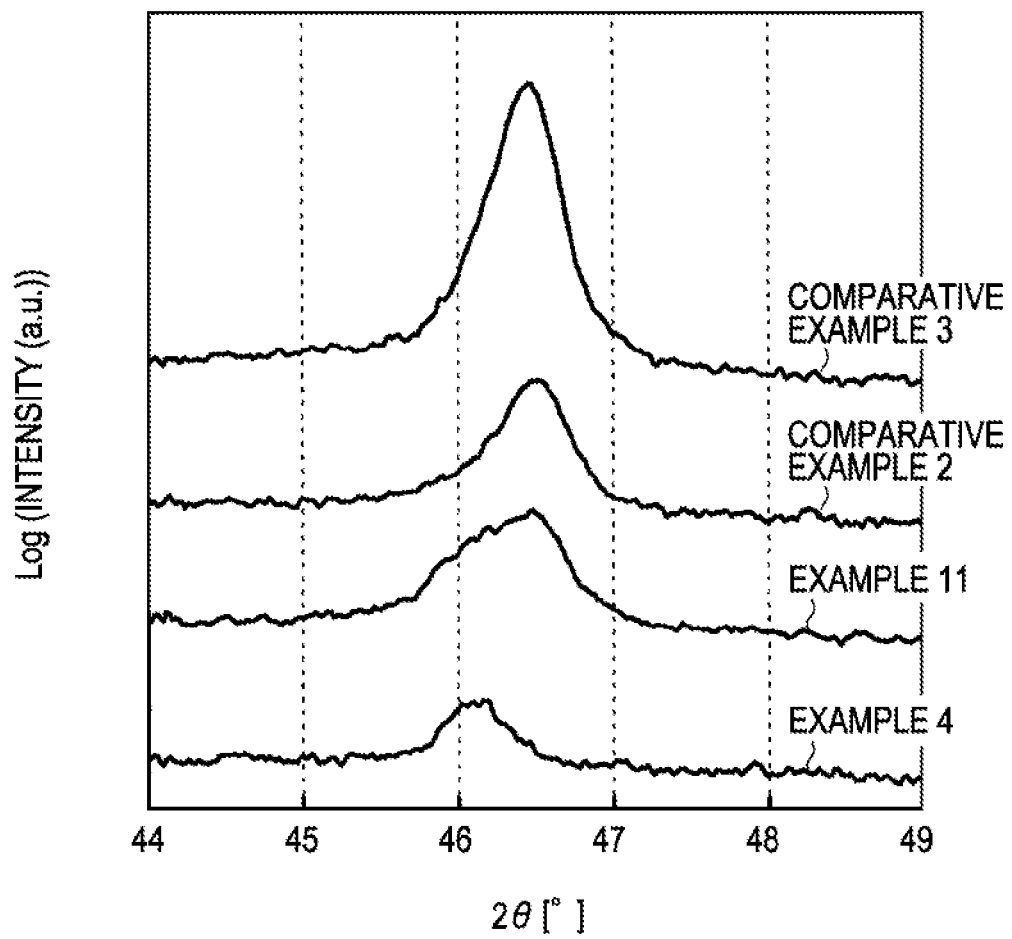
FIG. 19 is a graph showing a principal part of an X-ray diffraction pattern according to Test Example 2.
Figure 20:
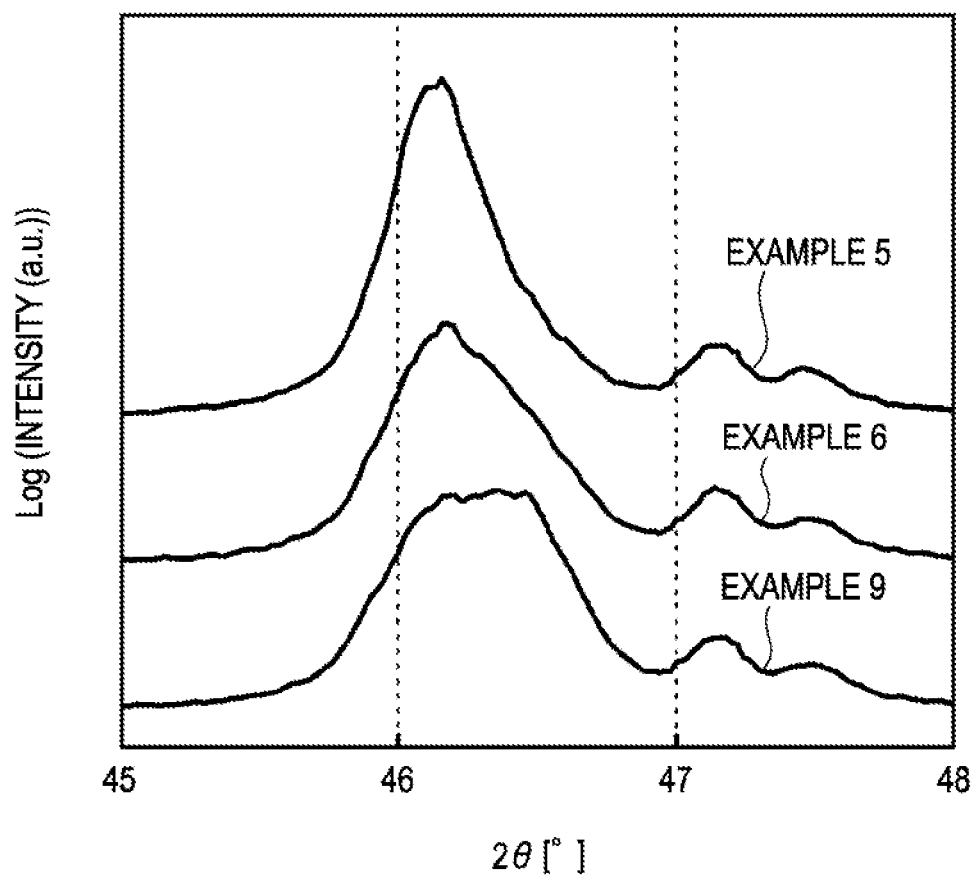
FIG. 20 is a graph showing an X-ray diffraction pattern according to Test Example 2.

The X-ray diffraction patterns of the piezoelectric elements 300 according to Examples 1 to 11 and Comparative Examples 1 to 7 were measured at room temperature with an X-ray diffractometer "D8 Discover" manufactured by Bruker AXS using a CuKα line as an X-ray source. An ABO$_3$ peak, a Si substrate peak, a Pt (111) peak, and a Pt (111) CuKβ peak were observed in all of Examples 1 to 11 and Comparative Examples 1 to 7. This result shows that the piezoelectric layers of Examples 1 to 11 and Comparative Examples 1 to 7 had an ABO$_3$ structure. FIGS. 18 and 19 show the X-ray diffraction patterns of Examples 4 and 11 and Comparative Examples 2 and 3, showing the diffraction intensity as a function of diffraction angle 2θ. FIG. 20 shows the X-ray diffraction patterns of Examples 5, 6, and 9. FIG. 19 is an enlarged view of FIG. 18.

FIGS. 18 and 19 show that Example 4 had a diffraction peak at 2θ of approximately 46.1°, Comparative Examples 2 and 3 had a diffraction peak at 2θ of approximately 46.5°, and Example 11 had both of these diffraction peaks. The above-mentioned P-V hystereses show that Comparative Examples 2 and 3 are antiferroelectric, and Example 4 is ferroelectric. Thus, the diffraction peak at 2θ=46.5° is assigned to the antiferroelectric phase, and the diffraction peak at 2θ=46.1° is assigned to the ferroelectric phase. These results show that Example 11 has a morphotropic phase boundary (MPB) in which the ferroelectric structure and the antiferroelectric structure coexist. No peak other than the substrate and ABO$_3$ peaks was observed, indicating the absence of a heterophase.

FIG. 20 shows $(Bi_{1-x},La_x)(Fe_{1-y},Mn_y)O_3$ and Si peaks at 2θ=45° to 48°, indicating coexistence of the ferroelectric phase and the antiferroelectric phase in Examples 5, 6, and 9, although the intensity ratios of the peaks were different.

The XRD results show that $(Bi_{1-x},La_x)(Fe_{1-y},Mn_y)O_3$ in the range of $0.17 \leq x \leq 0.20$ had MPB between the antiferroelectric phase and the ferroelectric phase.

The area intensity (AF) of a diffraction peak assigned to a ferroelectric phase and the area intensity ($A_{AF}$) of a diffraction peak assigned to an antiferroelectric phase of the diffraction patterns shown in FIG. 20 were determined by peak fitting with X-ray structure analysis software Topas 2.1 of Bruker Co. The peak function was Pearson IV. The peak assigned to a ferroelectric phase and the peak assigned to an antiferroelectric phase had the same full width at half maximum (FWHM), which depends on the apparatus and crystallinity. The $A_{AF}/A_F$ ratio was 0.1 for Example 5, 0.5 for Example 6, and 0.9 for Example 9.

Test Example 3

Figure 21:
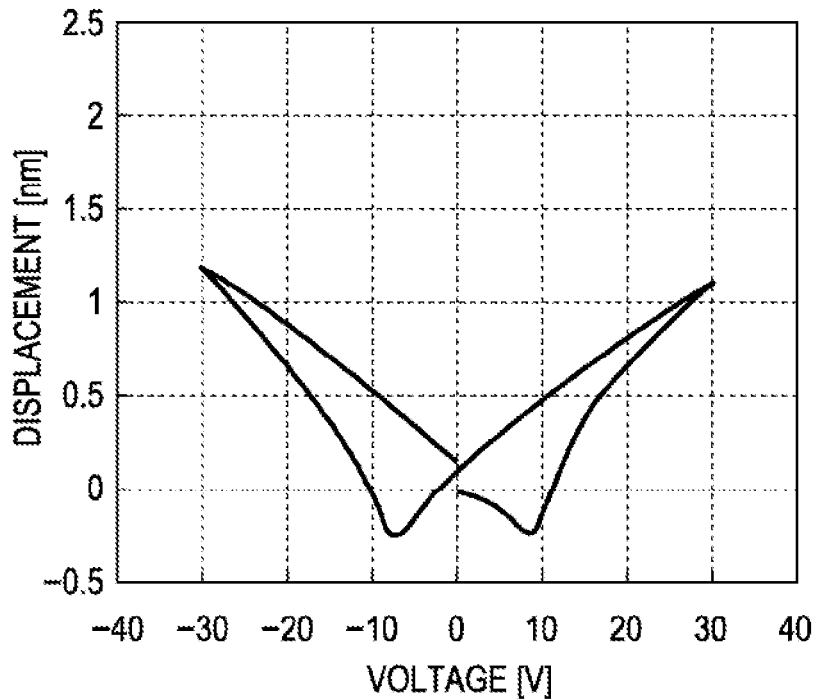
FIG. 21 is a graph showing an S-V curve according to Example 4.
Figure 22:
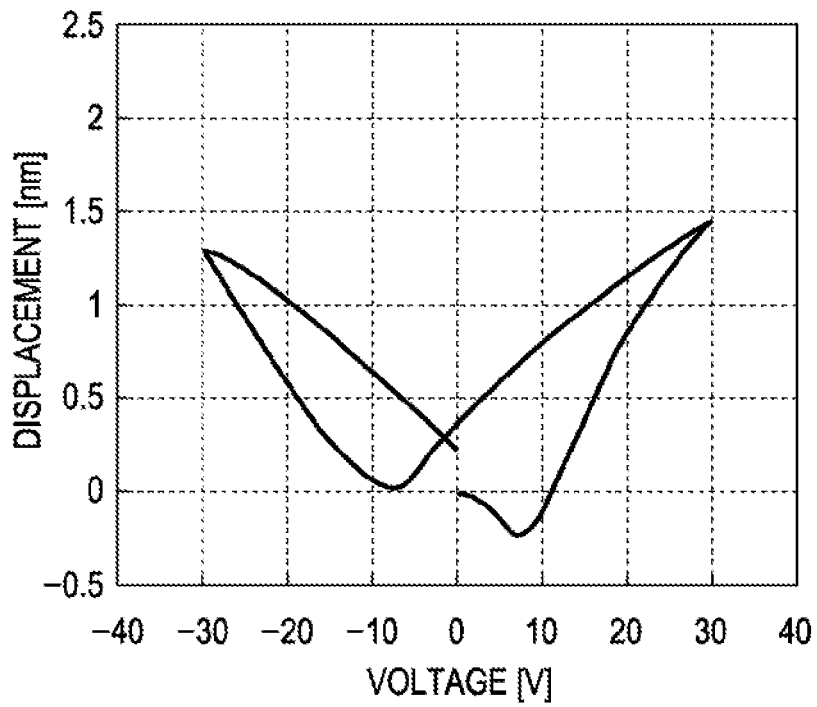
FIG. 22 is a graph showing an S-V curve according to Example 11.
Figure 23:
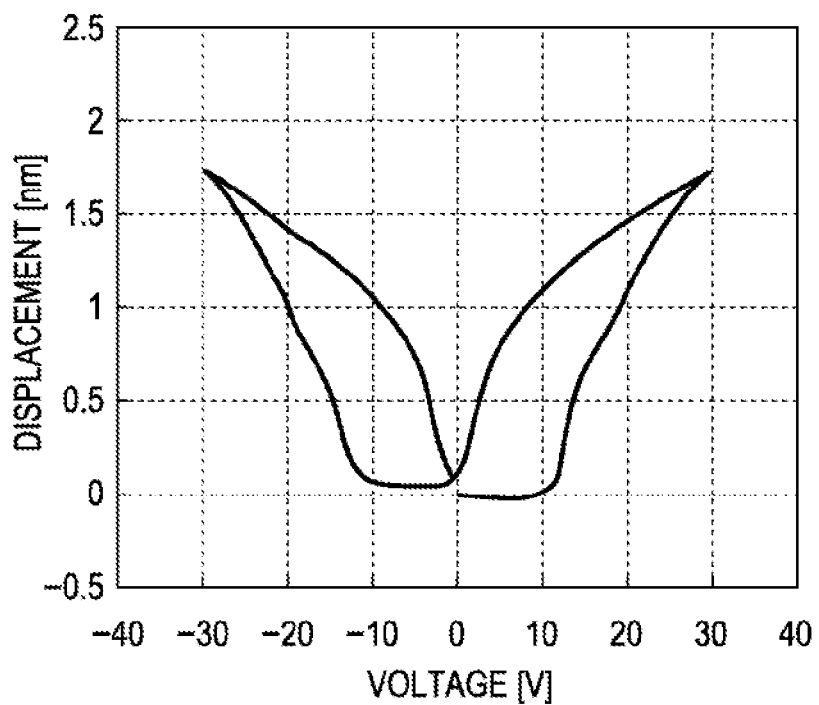
FIG. 23 is a graph showing an S-V curve according to Comparative Example 3.
Figure 24:
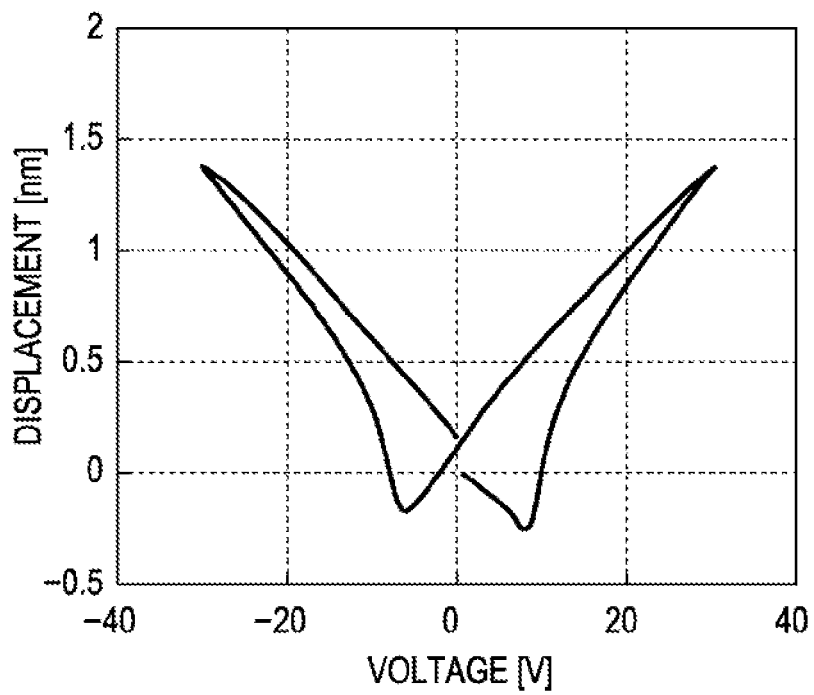
FIG. 24 is a graph showing an S-V curve according to Example 5.
Figure 25:
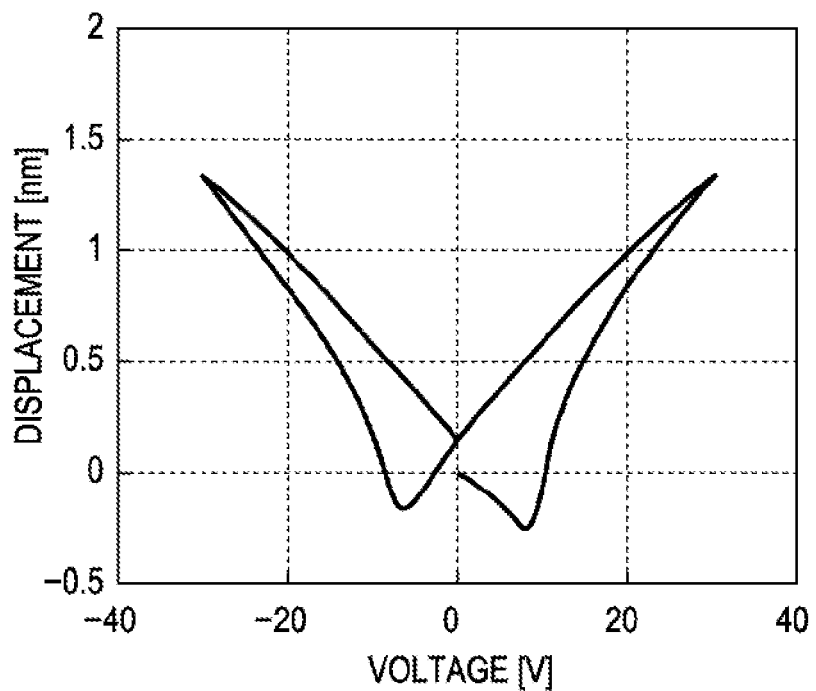
FIG. 25 is a graph showing an S-V curve according to Example 6.
Figure 26:
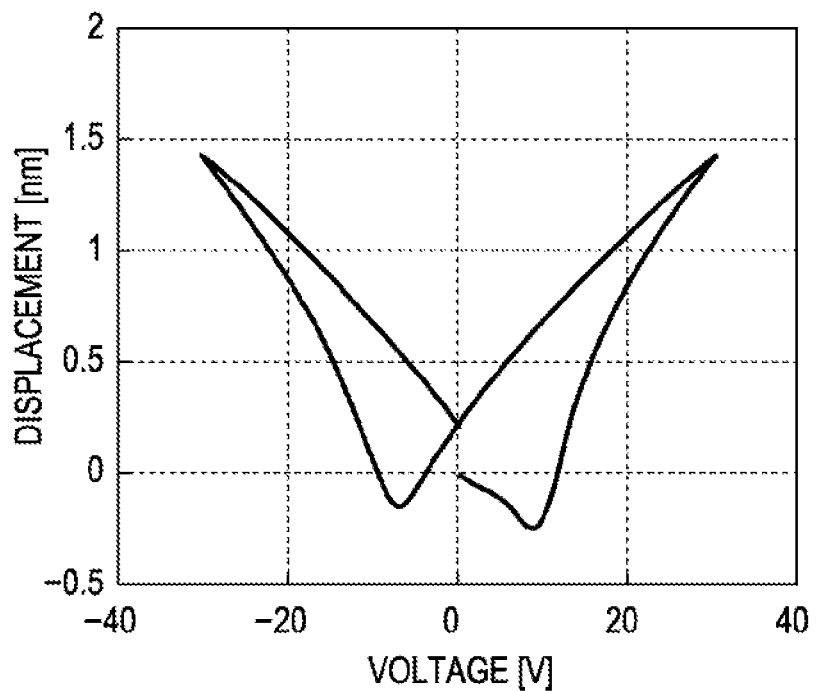
FIG. 26 is a graph showing an S-V curve according to Example 9.

The relationship between electric-field-induced strain and electric field strength for the piezoelectric elements 300 according to Examples 1 to 11 and Comparative Examples 1 to 7 was determined at room temperature with a double-beam laser interferometer (DBLI) manufactured by aix-ACCT Systems using an electrode pattern of $\phi$=500 μm at a frequency of 1 kHz. FIGS. 21 to 23 show the results for Examples 4 and 11 and Comparative Example 3, and FIGS. 24 to 26 show the results for Examples 5, 6, and 9.

FIGS. 21 to 23 show that the displacement at +30 V was 1.10 nm for Example 4, 1.43 nm for Example 11, and 1.72 nm for Comparative Example 3. FIG. 19 in Test Example 2 showed that Example 11 had MPB between the antiferroelectric phase and the ferroelectric phase. Accordingly, the electric-field-induced strain in Example 11 was 1.3 times the strain in Example 4. On the basis of the strain rate normalized to the film thickness, this corresponds to as high as 0.36%, which is comparable to the strain rate of PZT practically used. In Examples 4 and 11, the electric-field-induced strain changed linearly with voltage in the range of +30 to −7 V, which is characteristic of a ferroelectric substance.

Comparative Example 3 produced an electric-field-induced strain 1.2 times as large as the strain in Example 11. However, Comparative Example 3 was an antiferroelectric substance, and therefore had no electric-field-induced strain in the range of 0 to +10 V and had inflection in the range of +10 to 0 V.

Thus, in $(Bi_{1-x},La_x)(Fe_{1-y},Mn_y)O_3$, an antiferroelectric substance produced the largest electric-field-induced strain. However, in ferroelectric $(Bi_{1-x},La_x)(Fe_{1-y},Mn_y)O_3$, that is, in the range of $0.10 \le x \le 0.20$ and $0.01 \le y \le 0.09$, the ferroelectric substance produced a large electric-field-induced strain comparable to the strain rate of PZT, particularly when the ferroelectric substance approached a morphotropic phase boundary (MPB) between the ferroelectric structure and the antiferroelectric structure, or when x approached $0.17 \le x \le 0.20$ or even $0.19 \le x \le 0.20$. In addition, unlike the antiferroelectric substance, the piezoelectric strain of the ferroelectric substance changed linearly with voltage.

FIG. 26 shows that Example 9 had the largest displacement of 1.44 nm at 30 V. As shown in FIGS. 24 and 25, Examples 5 and 6 also had a large displacement, which was no less than 90% that of Example 9. While the displacement increased as the composition approached the composition of the antiferroelectric substance, even the displacement of a composition with x=0.78 and $A_{AF}/A_F$=0.1 was 90% or more of the displacement of a composition with x=0.20 and $A_{AF}/A_F$=0.9. Thus, a composition having an intensity ratio $A_{AF}/A_F$ of at least approximately 0.1 in XRD can have piezoelectricity comparable to the piezoelectricity of a composition having an intensity ratio $A_{AF}/A_F$ of 0.9.

The second electrode 80, which is the individual electrode of the piezoelectric element 300, is connected to a lead electrode 90. The lead electrode 90 may be formed of gold (Au) and extends from the neighborhood of an end of the ink feed channel 14 to the insulator film 55.

A protective substrate 30 having a reservoir portion 31, which constitutes at least part of a reservoir 100, is attached with an adhesive 35 to the flow-passage-forming substrate 10 on which the piezoelectric elements 300 are formed, that is, to the first electrode 60, the insulator film 55, and the lead electrode 90. The reservoir portion 31 is formed through the protective substrate 30 in the thickness direction and extends in the width direction of the pressure-generating chambers 12. As described above, the reservoir portion 31 communicates with the communication portion 13 in the flow-passage-forming substrate 10, constituting the reservoir 100. The reservoir 100 serves as a common ink chamber for the pressure-generating chambers 12. The communication portion 13 in the flow-passage-forming substrate 10 may be divided so as to correspond to each of the pressure-generating chambers 12, and only the reservoir portion 31 may function as a reservoir. Furthermore, for example, the flow-passage-forming substrate 10 may only include the pressure-generating chambers 12, and members between the flow-passage-forming substrate 10 and the protective substrate 30 (for example, the elastic film 50, the insulator film 55, and the like) may include ink feed channels 14 to connect the reservoir with the pressure-generating chambers 12.

A region of the protective substrate 30 opposite the piezoelectric elements 300 includes a piezoelectric-element-holding portion 32, which has a space so as not to prevent the displacement of the piezoelectric elements 300. As long as the piezoelectric-element-holding portion 32 has a space so as not to prevent the displacement of the piezoelectric elements 300, the space may be sealed or not.

The protective substrate 30 is preferably formed of a material having substantially the same thermal expansion coefficient as the flow-passage-forming substrate 10, for example, a glass or ceramic material. In the present embodiment, the protective substrate 30 is formed of a silicon single crystal, which is the same material as the flow-passage-forming substrate 10.

The protective substrate 30 includes a through-hole 33 passing through the protective substrate 30 in the thickness direction. The neighborhoods of the ends of the lead electrodes 90 extending from the piezoelectric elements 300 are exposed in the through-hole 33.

A drive circuit 120 for driving the piezoelectric elements 300 juxtaposed to each other is fixed onto the protective substrate 30. The drive circuit 120 may be a circuit board or a semiconductor integrated circuit (IC). The drive circuit 120 is electrically connected to the lead electrodes 90 via interconnecting wiring 121 using electroconductive wires, such as bonding wires.

The protective substrate 30 is attached to a compliance substrate 40. The compliance substrate 40 includes a sealing film 41 and a fixing sheet 42. The sealing film 41 is formed of a flexible material and seals one side of the reservoir portion 31. The fixing sheet 42 is formed of a relatively hard material. The fixing sheet 42 has an opening 43 on top of the reservoir 100. Thus, one side of the reservoir 100 is sealed with the flexible sealing film 41 alone.

In the ink jet print head I according to the present embodiment, the reservoir 100 to the nozzle openings 21 are filled with ink supplied from an ink inlet connected to an external ink supply unit (not shown). A voltage is applied between the first electrode 60 and the second electrode 80 on the corresponding pressure-generating chamber 12 in response to a print signal from the drive circuit 120 to deform the elastic film 50, the insulator film 55, the first electrode 60, and the piezoelectric layer 70. The deformation increases the internal pressure of the pressure-generating chamber 12, allowing ink droplets to be discharged from the corresponding nozzle opening 21.

Other Embodiments

While one embodiment of the invention has been described above, the basic structure of the invention is not limited to the embodiment described above. For example, although the $ABO_3$ complex oxide only contains Bi, La, Fe, and Mn as metallic elements in the first embodiment, the $ABO_3$ complex oxide can further contain another metal to achieve better piezoelectric characteristics.

Although the flow-passage-forming substrate 10 is a silicon single crystal substrate in the first embodiment, the flow-passage-forming substrate 10 may be an SOI substrate or a glass substrate.

Although the piezoelectric element 300 includes the first electrode 60, the piezoelectric layer 70, and the second electrode 80 on the substrate (the flow-passage-forming substrate 10) in the first embodiment, a piezoelectric material and an electrode-forming material may be alternately stacked to manufacture a longitudinal vibration piezoelectric element, which expands and contracts in the axial direction.

Figure 27:
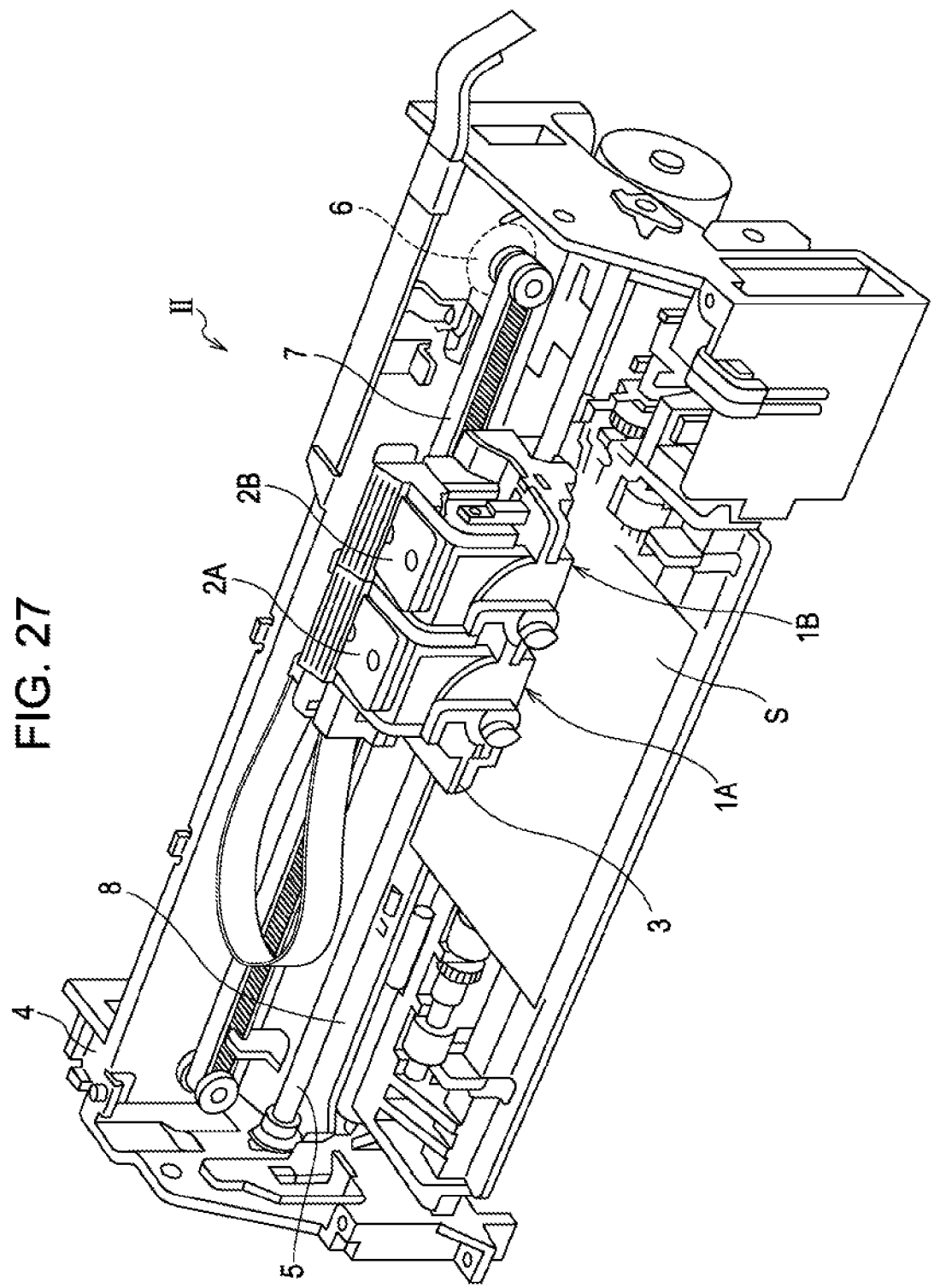
FIG. 27 is a schematic view of a printer according to one embodiment of the invention.

An ink jet print head according to any of the embodiments described above can be installed in an ink jet printer as one component of a print head unit that includes an ink path in communication with an ink cartridge. FIG. 27 is a schematic view of an ink jet printer according to an embodiment of the invention.

In an ink jet printer II illustrated in FIG. 27, print head units 1A and 1B include the ink jet print head I and house removable cartridges 2A and 2B. The cartridges 2A and 2B constitute an ink supply unit. A carriage 3 includes the print head units 1A and 1B and is mounted on a carriage shaft 5 attached to a main body 4 of the printer. The carriage 3 can move in the axial direction. For example, the print head units 1A and 1B discharge a black ink composition and a color ink composition, respectively.

When the driving force of a drive motor 6 is transferred to the carriage 3 via a plurality of gears (not shown) and a timing belt 7, the carriage 3 including the recording head units 1A and 1B is moved along the carriage shaft 5. The main body 4 of the printer includes a platen 8 along the carriage shaft 5. A recording sheet S, which is a recording medium, such as paper, can be fed by a feed roller (not shown) and transported over the platen 8.

While the ink jet print head has been described as an example of a liquid-ejecting head in the first embodiment, the invention is directed to a wide variety of general liquid-ejecting heads and, as a matter of course, can be applied to liquid-ejecting heads for ejecting liquid other than ink. Examples of other liquid-ejecting heads include print heads for use in image recorders, such as printers, coloring-material-ejecting heads for use in the manufacture of color filters for liquid crystal displays, electrode-material-ejecting heads for use in the formation of electrodes for organic EL displays and field-emission displays (FED), and bioorganic compound-ejecting heads for use in the manufacture of biochips.

The invention can be applied not only to piezoelectric elements installed in liquid-ejecting heads, such as ink jet print heads, but also to piezoelectric elements installed in ultrasonic devices, such as ultrasonic transmitters, ultrasonic motors, pressure sensors, and ferroelectric memories.

What is claimed is:

1. A piezoelectric element including a piezoelectric layer and a plurality of electrodes,
    wherein the piezoelectric layer contains a complex oxide having the following general formula:

$(Bi_{1-x},La_x)(Fe_{1-y},Mn_y)O_3$ $(0.10 \leq x \leq 0.20, 0.01 \leq y \leq 0.09)$; and
    wherein the piezoelectric layer undergoes an electric-field-induced phase transition from an antiferroelectric phase to a ferroelectric phase or phase transition from a ferroelectric phase to an antiferroelectric phase.

2. The piezoelectric element according to claim 1, wherein the x is in the range of $0.17 \leq x \leq 0.20$.

3. The piezoelectric element according to claim 1, wherein the x is in the range of $0.19 \leq x \leq 0.20$.

4. The piezoelectric element according to claim 1, wherein the y is in the range of $0.01 \leq y \leq 0.05$.

5. An ultrasonic device comprising:
    a piezoelectric element, the piezoelectric element including a piezoelectric layer and a plurality of electrodes,
    wherein the piezoelectric layer contains a complex oxide having the following general formula:

$(Bi_{1-x},La_x)(Fe_{1-y},Mn_y)O_3$ $(0.10 \leq x \leq 0.20, 0.01 \leq y \leq 0.09)$; and
    wherein the piezoelectric layer undergoes an electric-field-induced phase transition from an antiferroelectric phase to a ferroelectric phase or phase transition from a ferroelectric phase to an antiferroelectric phase.

6. The ultrasonic device according to claim 5, wherein the x is in the range of $0.17 \leq x \leq 0.20$.

7. An ultrasonic device according to claim 5, wherein the x is in the range of $0.19 \leq x \leq 0.20$.

8. An ultrasonic device according to claim 5, wherein the y is in the range of $0.01 \leq y \leq 0.05$.

* * * * *